(12) United States Patent
Seo et al.

(10) Patent No.: US 11,747,227 B2
(45) Date of Patent: Sep. 5, 2023

(54) ELECTRONIC DEVICE INCLUDING FORCE KEY STRUCTURE

(71) Applicant: Samsung Electronics Co., Ltd., Suwon-si (KR)

(72) Inventors: Bowoong Seo, Suwon-si (KR); Minsoo Kim, Suwon-si (KR); Yongho Hwang, Suwon-si (KR); Jinwan An, Suwon-si (KR); Jiwoo Lee, Suwon-si (KR); Yeunwook Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 469 days.

(21) Appl. No.: 16/931,371

(22) Filed: Jul. 16, 2020

(65) Prior Publication Data

US 2021/0018388 A1 Jan. 21, 2021

(30) Foreign Application Priority Data

Jul. 16, 2019 (KR) .......................... 10-2019-0085978

(51) Int. Cl.
*G01L 5/00* (2006.01)
*H05K 1/02* (2006.01)
(Continued)

(52) U.S. Cl.
CPC ............ *G01L 5/0038* (2013.01); *H05K 1/028* (2013.01); *H05K 1/118* (2013.01); *H05K 5/003* (2013.01)

(58) Field of Classification Search
CPC ...... G01L 5/0038; H05K 1/028; H05K 1/118; H05K 5/003
See application file for complete search history.

(56) References Cited

U.S. PATENT DOCUMENTS 8,284,567 B2 10/2012 Park et al.
8,780,054 B2 7/2014 Kim et al.
(Continued)

FOREIGN PATENT DOCUMENTS

JP 2017-130218 A 7/2017
KR 10-2010-0070006 A 6/2010
(Continued)

OTHER PUBLICATIONS

International Search Report dated Oct. 26, 2020 in connection with International Patent Application No. PCT/KR2020/009395, 3 pages.

*Primary Examiner* — Jamel E Williams

(57) ABSTRACT

Disclosed is an electronic device. The electronic device includes a sidewall structure that forms a surface of the electronic device and that includes a key area formed on the surface of the electronic device. The electronic device also includes an internal frame that is formed inside the electronic device and faces an inner surface of the sidewall structure. The electronic device further includes a sensor assembly disposed between the internal frame and the sidewall structure, at least part of the sensor assembly is aligned with the key area. The sensor assembly includes a sensor that senses a force applied to the key area, based on displacement of an inner surface of the key area. The sensor assembly also includes a support member having one surface supported on the sensor and an opposite surface supported on the internal frame.

20 Claims, 16 Drawing Sheets

(51) Int. Cl.
*H05K 5/00* (2006.01)
*H05K 1/11* (2006.01)

(56) References Cited

U.S. PATENT DOCUMENTS

| | | |
|---|---|---|
| 9,024,870 B2 | 5/2015 | Kim et al. |
| 9,383,829 B2 | 7/2016 | Liu et al. |
| 9,760,183 B2 * | 9/2017 | Kawaguchi ........ H03K 17/9622 |
| 9,778,775 B2 | 10/2017 | Park et al. |
| 10,048,793 B2 | 8/2018 | Park et al. |
| 10,338,719 B2 | 7/2019 | Li |
| 10,409,430 B2 | 9/2019 | Heo et al. |
| 10,466,830 B2 * | 11/2019 | Lee ..................... G06F 3/0485 |
| 2010/0079395 A1 | 4/2010 | Kim et al. |
| 2010/0085724 A1 | 4/2010 | Park et al. |
| 2014/0071056 A1 * | 3/2014 | Liu ..................... G06F 3/04892 |
| | | 345/169 |
| 2015/0346839 A1 | 12/2015 | Kawaguchi et al. |
| 2017/0277359 A1 * | 9/2017 | Lee ..................... G06F 3/0488 |
| 2017/0336970 A1 * | 11/2017 | Kim .................... G06F 3/04883 |
| 2018/0164938 A1 * | 6/2018 | Li ....................... G06V 40/13 |
| 2019/0073077 A1 * | 3/2019 | Kim .................... G06F 3/0445 |

FOREIGN PATENT DOCUMENTS

| | | |
|---|---|---|
| KR | 10-2010-0120423 A | 11/2010 |
| KR | 10-2014-0147647 A | 12/2014 |
| KR | 10-2017-0003874 A | 1/2017 |
| KR | 10-2017-0129372 A | 11/2017 |
| KR | 10-2018-0028857 A | 3/2018 |
| KR | 10-2019-0027801 A | 3/2019 |

* cited by examiner

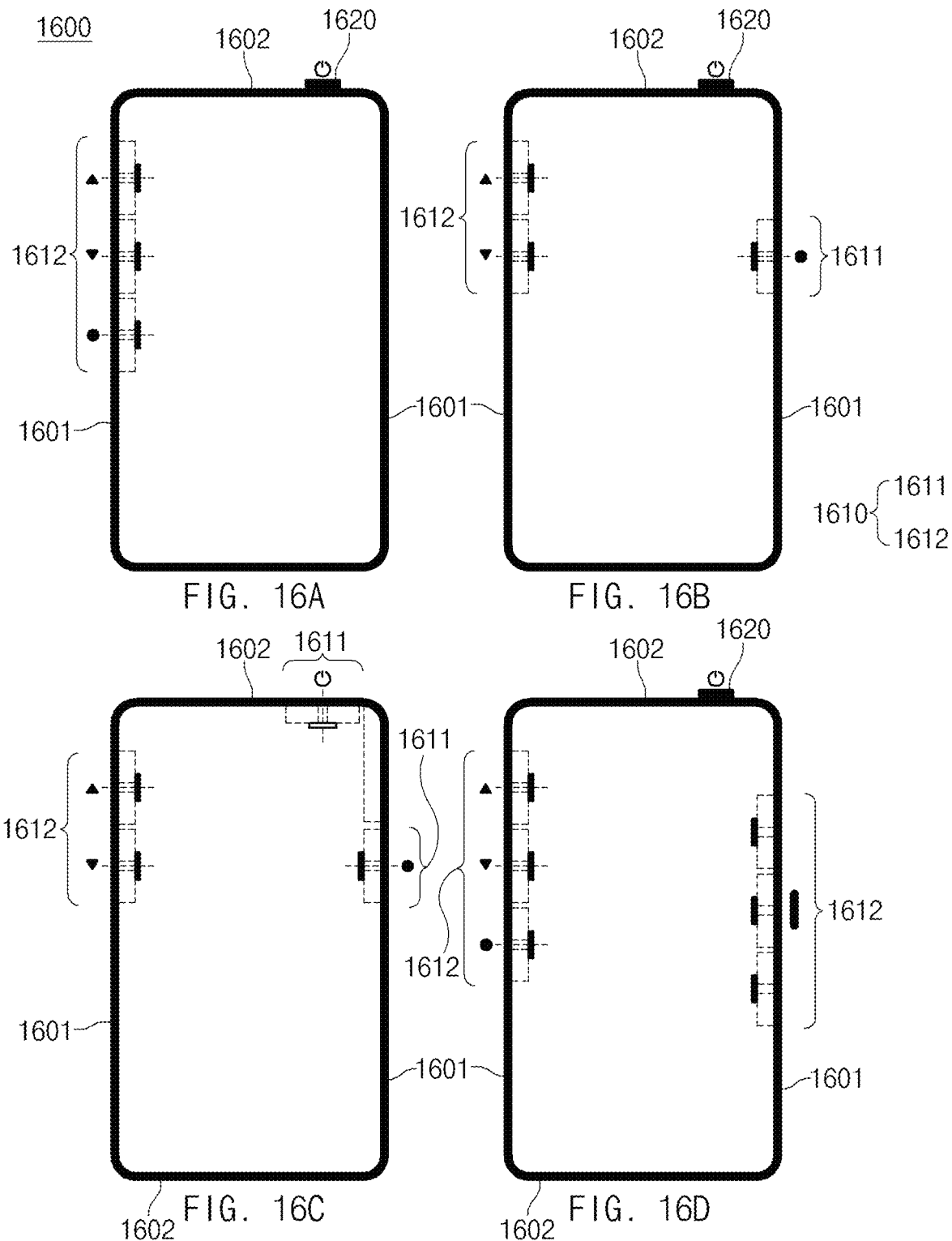

ELECTRONIC DEVICE INCLUDING FORCE KEY STRUCTURE

CROSS-REFERENCE TO RELATED APPLICATION

This application is based on and claims priority under 35 U.S.C. § 119 to Korean Patent Application No. 10-2019-0085978 filed on Jul. 16, 2019 in the Korean Intellectual Property Office, the disclosure of which is incorporated by reference herein its entirety.

BACKGROUND

1. Field

The disclosure relates to an electronic device including a force key structure.

2. Description of Related Art

An electronic device may include a button key structure received in an opening formed on a surface of the housing. Foreign matter may be introduced into the electronic device through the opening. The electronic device may include a force key structure for detecting a force applied to the surface of the housing. The force key structure detects the force using displacement of the surface itself and therefore has no passage, such as the opening, through which foreign matter is introduced into the electronic device.

The above information is presented as background information only to assist with an understanding of the disclosure. No determination has been made, and no assertion is made, as to whether any of the above might be applicable as prior art with regard to the disclosure.

SUMMARY

The force key structure in the related art may include a force sensor attached to an inner surface of the housing. An adhesive material may affect the performance of the sensor depending on a temperature change. For example, in a case where the housing is formed of a metallic material, physical properties of the adhesive material may vary depending on a change in external temperature, and the variation may affect the performance of the attached sensor. Furthermore, as time elapses, the adhesive material cannot provide a sufficient adhesive force capable of firmly attaching the sensor. In addition, in a force key assembly process, a process of attaching the sensor to the inner surface of the housing may be additionally performed, and maintenance may be difficult.

Aspects of the disclosure are to address at least the above-mentioned problems and/or disadvantages and to provide at least the advantages described below. Accordingly, an aspect of the disclosure is to provide a force key structure including a sensor disposed on an inner surface of a housing without a separate adhesive material, and an electronic device including the force key structure.

In accordance with an aspect of the disclosure, an electronic device includes a sidewall structure that forms a surface of the electronic device and that includes a key area formed on the surface of the electronic device, an internal frame that is formed inside the electronic device and that faces an inner surface of the sidewall structure, and a sensor assembly disposed between the internal frame and the sidewall structure, at least part of the sensor assembly being aligned with the key area. The sensor assembly includes a sensor that senses a force applied to the key area, based on displacement of an inner surface of the key area and a support member having one surface supported on the sensor and an opposite surface supported on the internal frame.

In accordance with another aspect of the disclosure, an electronic device includes a sidewall structure that forms a surface of the electronic device, an internal frame disposed inside the electronic device, and a force key structure. The force key structure includes a key area formed on part of the surface of the electronic device, a sensor disposed between the sidewall structure and the internal frame, at least part of the sensor being aligned with the key area, and a support member disposed between the sensor and the internal frame, and the sensor and the support member are press-fit between the sidewall structure and the internal frame.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 16A to 16D illustrate views of an electronic device according to various embodiments.

With regard to description of the drawings, identical or similar reference numerals may be used to refer to identical or similar components.

DETAILED DESCRIPTION

FIGS. 1 through 16D, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure.

Figure 1:
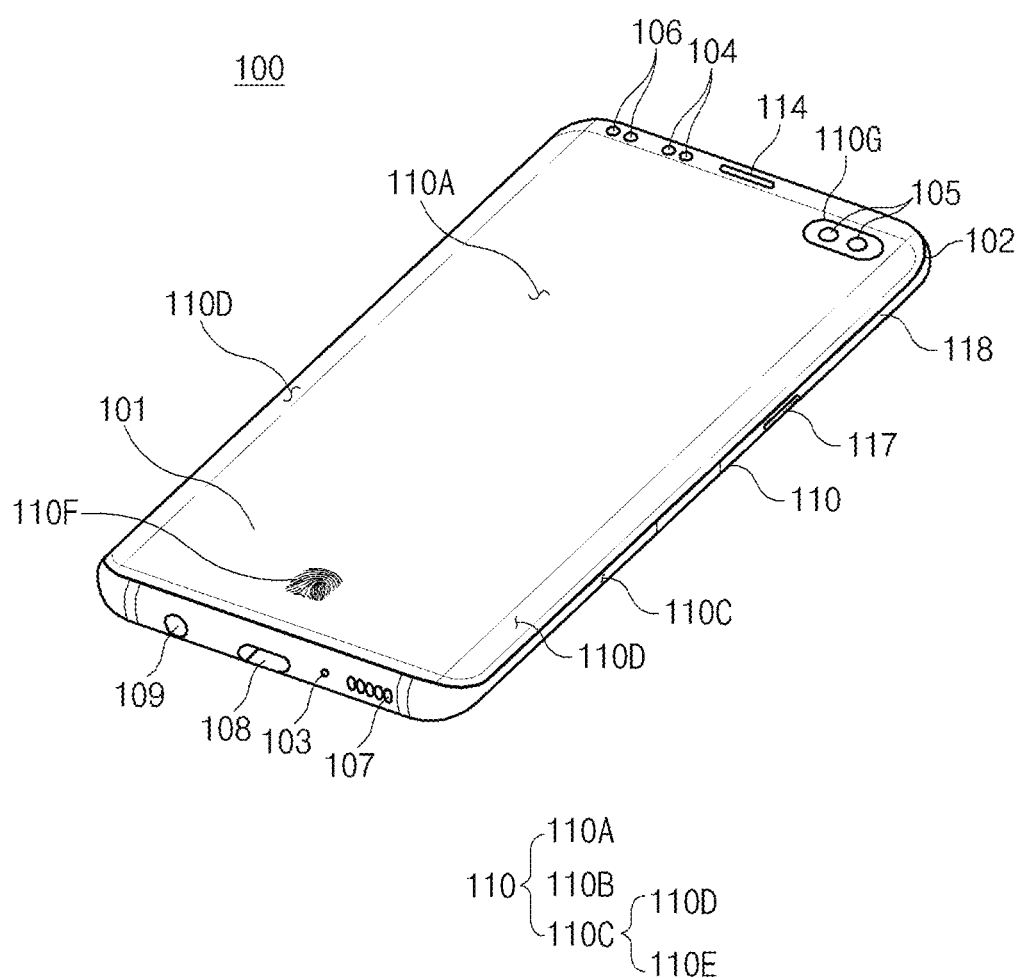
FIG. 1 illustrates a front perspective view of an electronic device according to an embodiment.
Figure 2:
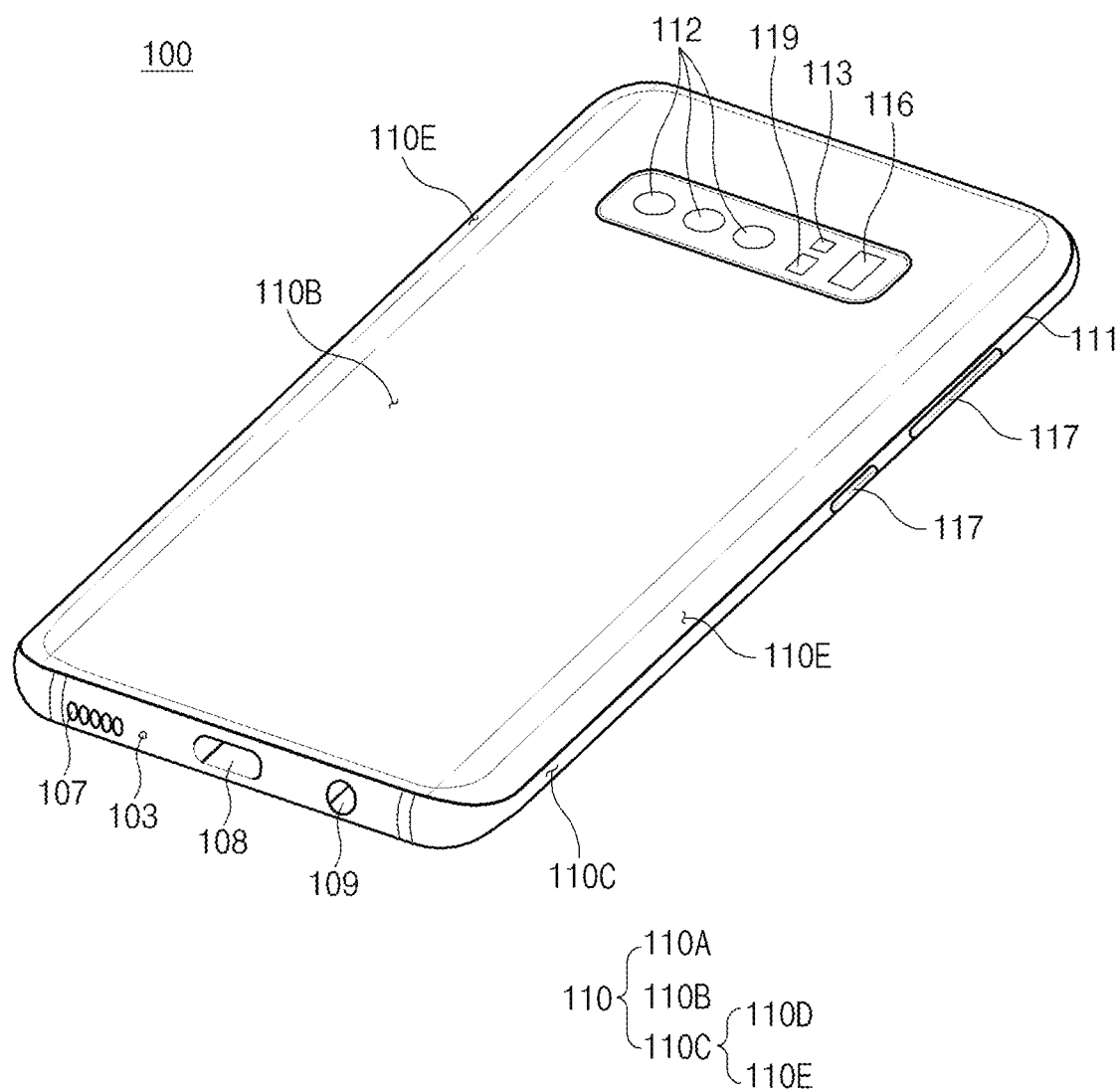
FIG. 2 illustrates a rear perspective view of the electronic device according to an embodiment.

FIG. 1 illustrates a front perspective view of an electronic device according to an embodiment. FIG. 2 illustrates a rear perspective view of the electronic device according to an embodiment.

Referring to FIGS. 1 and 2, the electronic device 100 according to an embodiment may include a housing 110 that includes a first surface (or a front surface) 110A, a second surface (or a second surface) 110B, and side surfaces 110C that surround a space between the first surface 110A and the second surface 110B.

In another embodiment (not illustrated), the housing 110 may refer to a structure that forms some of the first surface 110A, the second surface 110B, and the side surfaces 110C of FIG. 1.

According to an embodiment, the first surface 110A may be formed by a front plate 102, at least part of which is substantially transparent (e.g., a glass plate including various coating layers, or a polymer plate). The second surface 110B may be formed by a back plate 111 that is substantially opaque. The back plate 111 may be formed by, for example, coated or colored glass, ceramic, a polymer, metal (e.g., aluminum, stainless steel (STS), or magnesium), or a combination of at least two thereof. The side surfaces 110C may be formed by a side bezel structure (or a "side member") 118 that is coupled with the front plate 102 and the back plate 111 and that contains metal and/or a polymer.

In some embodiments, the back plate 111 and the side bezel structure 118 may be integrated with each other and may contain the same material (e.g., a metallic material such as aluminum).

In the illustrated embodiment, the front plate 102 may include, at opposite long edges thereof, two first areas 110D that curvedly and seamlessly extend toward the back plate 111 from the first surface 110A.

In the illustrated embodiment (refer to FIG. 2), the back plate 111 may include, at opposite long edges thereof, two second areas 110E that curvedly and seamlessly extend toward the front plate 102 from the second surface 110B.

In some embodiments, the front plate 102 (or the back plate 111) may include only one of the first areas 110D (or the second areas 110E). In another embodiment, the front plate 102 (or the back plate 111) may not include a part of the first areas 110D (or the second areas 110E).

In the embodiments, when viewed from a side of the electronic device 100, the side bezel structure 118 may have a first thickness (or width) at sides (e.g., short sides) not including the first areas 110D or the second areas 110E and may have a second thickness at sides (e.g., long sides) including the first areas 110D or the second areas 110E, the second thickness being smaller than the first thickness.

According to an embodiment, the electronic device 100 may include at least one of a display 101, audio holes 103, 107, and 114, sensor modules 104, 116, and 119, camera devices 105, 112, and 113, key input devices 117, a light emitting element 106, and first and second connector holes 108 and 109. In some embodiments, the electronic device 100 may not include at least one component (e.g., the key input devices 117 or the light emitting element 106) among the aforementioned components, or may additionally include other component(s).

The display 101 may be exposed through, for example, a large portion of the front plate 102. In some embodiments, at least part of the display 101 may be exposed through the front plate 102 that includes the first surface 110A and the first areas 110D of the side surfaces 110C.

In some embodiments, the periphery of the display 101 may be formed to be substantially the same as the shape of the adjacent outside edge of the front plate 102. In another embodiment (not illustrated), the gap between the periphery of the display 101 and the periphery of the front plate 102 may be substantially constant to expand the area by which the display 101 is exposed.

In an embodiment, a surface of the housing 110 (or the front plate 102) may include a screen display area that is formed as the display 101 is visually exposed. For example, the screen display area may include the first surface 110A and the first areas 110D of the side surfaces 110C.

In the illustrated embodiment, the screen display area 110A and 110D may include a sensing area 110F configured to obtain biometric information of a user. Here, when the screen display area (the first surface 110A and the first areas 110D) includes the sensing area 110F, this may mean that at least part of the sensing area 110F overlaps the screen display area (the first surface 110A and the first areas 110D). In other words, the sensing area 110F may refer to an area capable of displaying visual information by the display 101 similarly to the other areas of the screen display area (the first surface 110A and the first areas 110D) and additionally obtaining the user's biometric information (e.g., fingerprint).

In the illustrated embodiment, the screen display area (the first surface 110A and the first areas 110D) of the display 101 may include an area 110G through which the first camera device 105 (e.g., a punch hole camera) is visually exposed. At least part of the periphery of the area 110G, through which the first camera device 105 is exposed, may be surrounded by the screen display area (the first surface 110A and the first areas 110D). In various embodiments, the first camera device 105 may include a plurality of camera devices.

In another embodiment (not illustrated), recesses or openings may be formed in the screen display area (the first surface 110A and the first areas 110D) of the display 101, and the electronic device 100 may include at least one of the receiver hole 114, the sensor module 104, and the light emitting element 106 that are aligned with the recesses or the openings.

In another embodiment (not illustrated), the display 101 may include, on a rear surface of the screen display area (the first surface 110A and the first areas 110D), at least one of the receiver hole 114, the sensor modules 104, 116, and 119, and the light emitting element 106.

In another embodiment (not illustrated), the display 101 may be coupled with, or disposed adjacent to, touch detection circuitry, a pressure sensor for measuring the intensity (pressure) of a touch, and/or a digitizer for detecting a stylus pen of a magnetic type.

In some embodiments, at least a part of the sensor modules 104, 116, and 119 and/or at least a part of the key input devices 117 may be disposed on the side surfaces 110C (e.g., the first areas 110D and/or the second areas 110E).

The audio holes 103, 107, and 114 may include the microphone hole 103 and the speaker holes 107 and 114. A microphone for obtaining a sound from the outside may be disposed in the microphone hole 103, and in some embodiments, a plurality of microphones may be disposed in the microphone hole 103 to sense the direction of a sound. The speaker holes 107 and 114 may include the external speaker hole 107 and the receiver hole 114 for a telephone call. In some embodiments, the speaker holes 107 and 114 and the microphone hole 103 may be implemented with one hole, and a speaker (e.g., a piezoelectric speaker) may be included without the speaker holes 107 and 114.

The sensor modules 104, 116, and 119 may generate an electrical signal or a data value that corresponds to an operational state inside the electronic device 100 or an environmental state external to the electronic device 100. For example, the sensor modules 104, 116, and 119 may include the sensor module 104 (e.g., a proximity sensor) that is disposed on the first surface 110A of the housing, the second sensor module 116 (e.g., a TOF camera device) that is disposed on the second surface 110B of the housing 110, the third sensor module 119 (e.g., an HRM sensor) that is disposed on the second surface 110B of the housing 110, and/or the fourth sensor module (e.g., a sensor 190 of FIG. 3) (e.g., a fingerprint sensor) that is coupled to the display 101.

In various embodiments, the second sensor module 116 may include a TOF camera device for measurement of distance.

In various embodiments, at least part of the fourth sensor module (e.g., the sensor 190 of FIG. 3) may be disposed under the screen display area (the first surface 110A and the first areas 110D). For example, the fourth sensor module may be disposed in a recess (e.g., a recess 139 of FIG. 3) that is formed on a rear surface of the display 101. That is, the fourth sensor module (e.g., the sensor 190 of FIG. 3) may not be exposed on the screen display area (the first surface 110A and the first areas 110D) and may form the sensing area 110F on at least part of the screen display area (the first surface 110A and the first areas 110D).

In some embodiments (not illustrated), the fingerprint sensor may be disposed on the second surface 110B as well as the first surface 110A of the housing 110 (e.g., the screen display area (the first surface 110A and the first areas 110D)).

In various embodiments, the electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera devices 105, 112, and 113 may include the first camera device 105 (e.g., a punch hole camera device) that is exposed through the first surface 110A of the electronic device 100, and the second camera device 112 and/or the flash 113 exposed through the second surface 110B of the electronic device 100.

In the illustrated embodiment, the first camera device 105 may be exposed through part of the first areas 110D of the first surface 110A. For example, the first camera device 105 may be exposed on a partial area of the first areas 110D through an opening (not illustrated) that is formed in part of the display 101.

In the illustrated embodiment, the second camera device 112 may include a plurality of camera devices (e.g., a dual camera or a triple camera). However, the second camera device 112 is not necessarily limited to including the plurality of camera devices, and may include one camera device.

The first camera device 105 and the second camera device 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment, the electronic device 100 may not include all or some of the aforementioned key input devices 117, and the key input devices 117 not included may be implemented in a different form, such as a soft key, on the display 101. In some embodiments, the key input devices may include a sensor module (e.g., the sensor 190 of FIG. 3) that forms the sensing area 110F included in the screen display area (the first surface 110A and the first areas 110D).

The light emitting element 106 may be disposed on, for example, the screen display 110A of the housing 110. For example, the light emitting element 106 may provide state information of the electronic device 100 in the form of light. In another embodiment, the light emitting element 106 may provide, for example, a light source that operates in conjunction with the first camera device 105. The light emitting element 106 may include, for example, an LED, an IR LED, and a xenon lamp.

The connector holes 108 and 109 may include the first connector hole 108 for receiving a connector (e.g., a USB connector) for transmitting and receiving power and/or data with an external electronic device, and/or the second connector hole 109 (e.g., an earphone jack) for receiving a connector for transmitting and receiving audio signals with an external electronic device.

Figure 3:
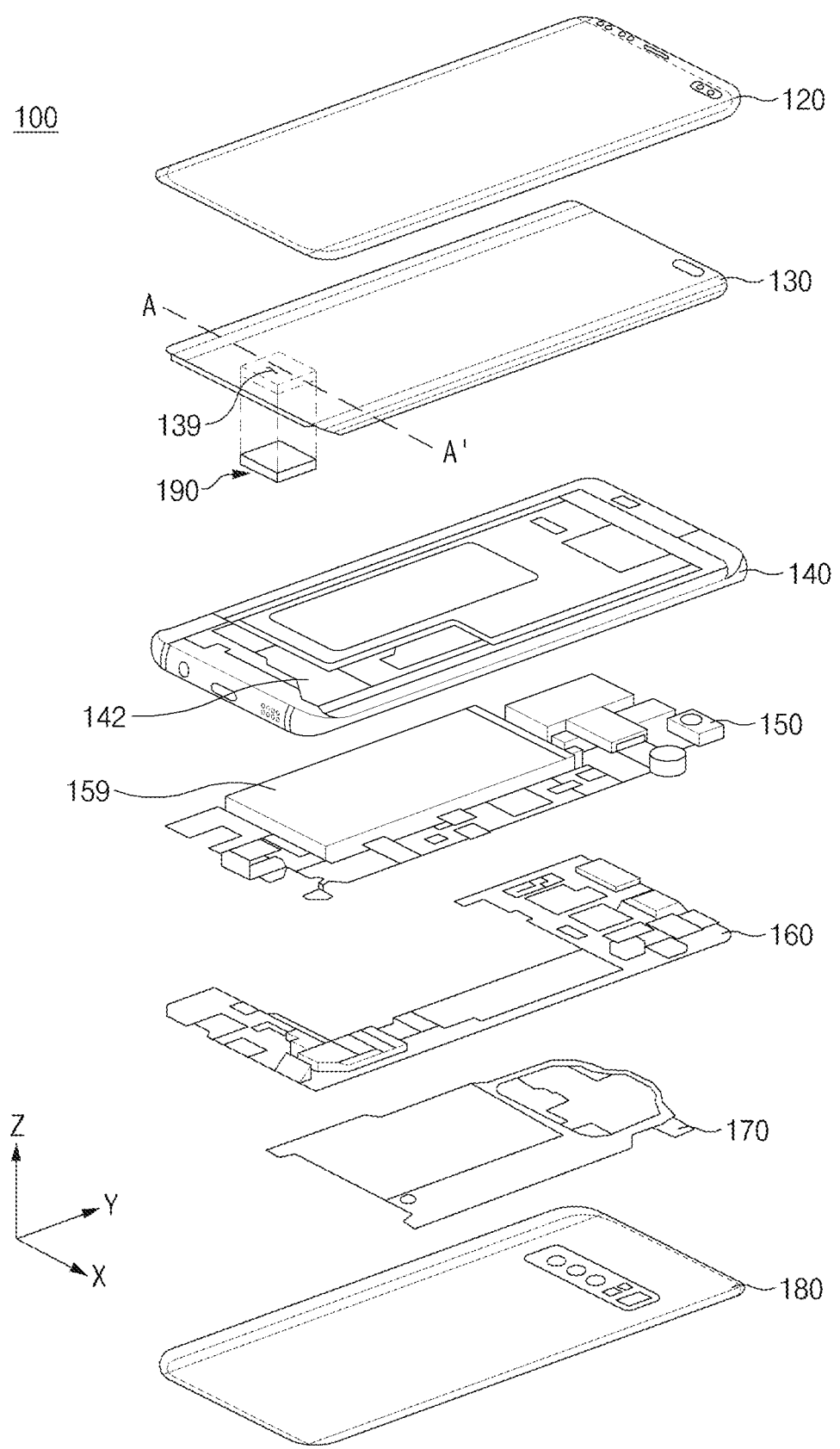
FIG. 3 illustrates an exploded perspective view of an electronic device according to an embodiment.

FIG. 3 illustrates an exploded perspective view of an electronic device according to an embodiment.

Referring to FIG. 3, the electronic device 100 may include a first cover 120 (e.g., the front surface 110A and the first areas 110D of FIG. 1), a display 130 (e.g., the display 101 of FIG. 1), a side member 140 (e.g., a part of the side surfaces 110C of FIG. 1), a first support member 142 (e.g., a bracket), a printed circuit board 150, a battery 159, a mid-plate 160 (e.g., a rear case), an antenna 170, and a second cover 180 (e.g., the second surface 110B and the second areas 110E of FIG. 1). In some embodiments, the electronic device 100 may not include at least one component (e.g., the first support member 142 or the mid-plate 160) among the aforementioned components, or may additionally include other component(s). At least one of the components of the electronic device 100 may be the same as, or similar to, at least one of the components of the electronic device 100 of FIG. 1 or FIG. 2, and repetitive descriptions will hereinafter be omitted.

The first support member 142 may be disposed in the electronic device 100 and may be connected with the side member 140, or may be integrated with the side member 140. The first support member 142 may be formed of, for example, a metallic material and/or a nonmetallic (e.g., polymer) material. The display 130 may be coupled to one surface of the first support member 142, and the printed circuit board 150 may be coupled to an opposite surface of the first support member 142. A processor, a memory, and/or an interface may be mounted on the printed circuit board 150. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 100 with an external electronic device and may include a USB connector, an SD card/MMC connector, or an audio connector.

The battery 159, which is a device for supplying power to at least one component of the electronic device 100, may include, for example, a primary cell that is not rechargeable, a secondary cell that is rechargeable, or a fuel cell. For example, at least part of the battery 159 may be disposed on substantially the same plane as the printed circuit board 150. The battery 159 may be integrally disposed in the electronic device 100 and may be disposed so as to be detachable from the electronic device 100.

The antenna 170 may be disposed between the second cover 180 and the battery 159. The antenna 170 may include, for example, a near field communication (NFC) antenna, a wireless charging antenna, and/or a magnetic secure transmission (MST) antenna. For example, the antenna 170 may perform short range communication with an external device, or may wirelessly transmit and receive power required for charging. In another embodiment, an antenna structure may be formed by the side member 140 and/or part of the first support member 142, or a combination thereof.

Figure 4:
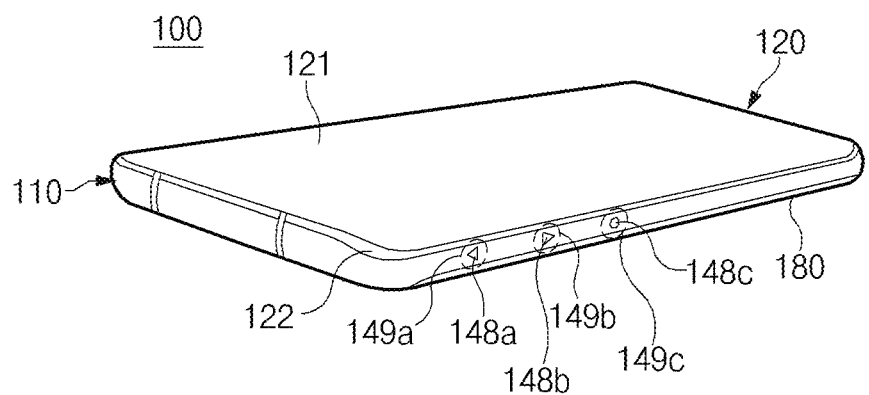
FIG. 4 illustrates a view of the external appearance of an electronic device according to various embodiments.

FIG. 4 illustrates a view of the external appearance of an electronic device according to various embodiments.

Electronic devices disclosed herein may include a foldable electronic device (e.g., an electronic device including a foldable display), a rollable electronic device (e.g., an electronic device including a rollable display), and a wearable electronic device (e.g., an electronic device in a watch form that is worn on a user's wrist) as well as the electronic device in the form illustrated in FIG. 4.

In various embodiments, the electronic device 100 may include a housing 110 that includes a first cover 120, a second cover 180, and a side member 140.

In various embodiments, the first cover 120, the second cover 180, and the side member 140 may form surfaces of the electronic device 100. For example, the first cover 120 may form a front surface of the electronic device 100, the second cover 180 may form a rear surface of the electronic device 100, and the side member 140 may form side surfaces of the electronic device 100.

In various embodiments, the first cover 120 may be formed to be transparent such that a display (e.g., the display 130 of FIG. 3) that is disposed in the electronic device 100 is visually visible. For example, the first cover 120 may be formed of a glass material. The first cover 120 may include a screen display area 121 formed by the display disposed in the electronic device 100. The first cover 120 may include a bezel area 122 formed around the screen display area 121. In various embodiments, the first cover 120 may include a flat area and a curved area formed around the flat area. The flat area may substantially include the screen display area 121. The curved area may include part of the screen display area 121 and the bezel area 122.

In various embodiments, the second cover 180 may be formed to be opposite the first cover 120. The second cover 180 may be spaced apart from the first cover 120 at a predetermined interval. The second cover 180 may be connected with the first cover 120 by the side member 140. The display may be disposed in a space between the second cover 180 and the first cover 120.

In various embodiments, the side member 140 may be formed to surround an interior space between the first cover 120 and the second cover 180. A mechanical component (e.g., the printed circuit board 150 and the mid-plate 160 of FIG. 3) and an electrical component (e.g., the display 130 of FIG. 3) may be disposed in the interior space. The side member 140, together with the first cover 120 and the second cover 180, may constitute the housing 110 of the electronic device 100.

In various embodiments, the side member 140 may include key areas 149a, 149b, and 149c on a surface thereof. The side member 140 may contain metal. The key areas 149a, 149b, and 149c may be formed on a side surface of the electronic device 100. The key areas 149a, 149b, and 149c may have displacement in a direction toward the interior space of the housing 110. For example, the key areas 149a, 149b, and 149c may be bent toward the interior space. When pressure is applied to the key areas 149a, 149b, and 149c, functions of the electronic device 100 that correspond to the relevant key areas 149a, 149b, and 149c may be performed. The key areas 149a, 149b, and 149c may include indicators 148a, 148b, and 148c that indicate the functions.

In some embodiments, the key areas 149a, 149b, and 149c may include a metal area containing a metallic material and a polymer area formed of a polymer material. For example, the polymer area may include an area molded by injecting a polymer material into an opening formed through the metal area.

In various embodiments, the key areas 149a, 149b, and 149c may include the first key area 149a related to a first function of the electronic device 100, the second key area 149b related to a second function of the electronic device 100, and the third key area 149c related to a third function of the electronic device 100. For example, referring to FIG. 4, the key areas 149a, 149b, and 149c may include the first key area 149a for turning up the volume of the electronic device 100, the second key area 149b for turning down the volume of the electronic device 100, and the third key area 149c for turning on/off the power of the electronic device 100. In various embodiments, the third key area 149c may include a camera shortcut key for executing a camera function or a Bixby key for executing the Bixby function.

For example, when the first key area 149a has displacement in a direction toward the interior space of the housing 110 by pressure applied to the first key area 149a, the volume of the electronic device 100 may be turned up. When the second key area 149b has displacement in a direction toward the interior space of the housing 110 by pressure applied to the second key area 149b, the volume of the electronic device 100 may be turned down. When the third key area 149c has displacement in a direction toward the interior space of the housing 110 by pressure applied to the third key area 149c, the power of the electronic device 100 may be supplied or shut off, or the electronic device 100 may be rebooted.

For example, the first indicator 148a included in the first key area 149a may be formed in a shape in which volume-up is designed. The second indicator 148b included in the second key area 149b may be formed in a shape in which volume-down is designed.

In various embodiments, the key areas 149a, 149b, and 149c may be distinguished from the remaining areas of the surface of the housing 110 in various ways. This may help a user to distinguish (identify) the key areas 149a, 149b, and 149c. For example, the key areas 149a, 149b, and 149c may be engraved or embossed on the surface of the housing 110, or may be implemented with a bumpy structure on the surface of the housing 110. For example, the key areas 149a, 149b, and 149c may have different texture from the other areas. For example, the key areas 149a, 149b, and 149c may be implemented by varying luster (e.g., matte or glossy) or by varying surface roughness (e.g., sandblasting).

Figure 5A:
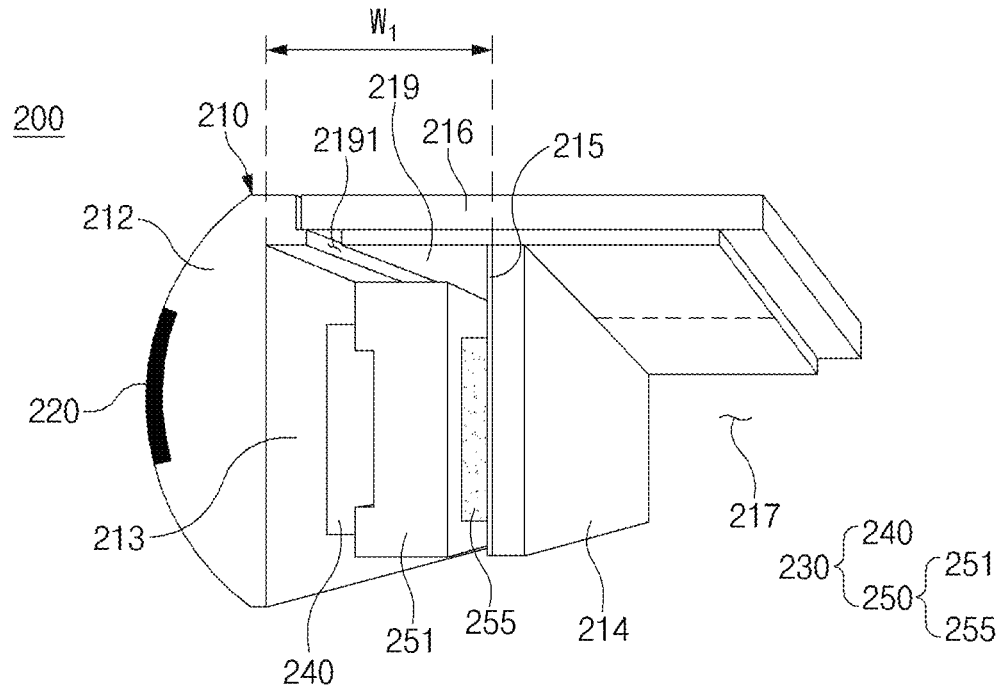
FIGS. 5A and 5B illustrate views of a force key structure of an electronic device according to various embodiments.
Figure 5B:
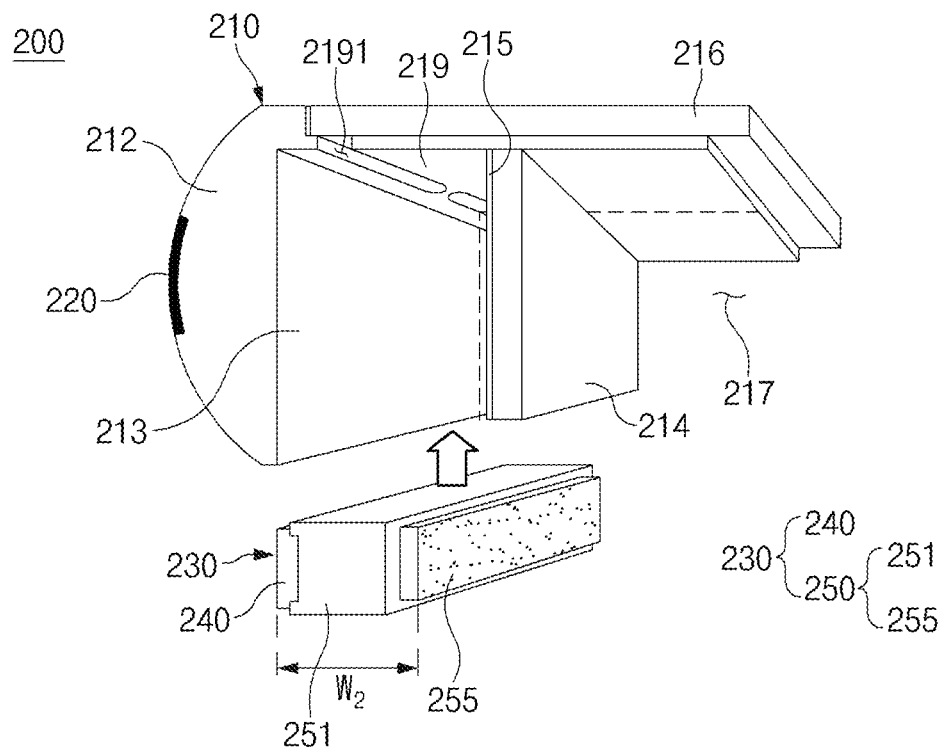

FIGS. 5A and 5B illustrate views of a force key structure of an electronic device according to various embodiments. FIG. 5A is an internal perspective view illustrating a coupling of the force key structure and the electronic device. FIG. 5B is an exploded perspective view of the force key structure and the electronic device.

In the illustrated embodiment, the electronic device 100 may include a housing 210 that includes a sidewall structure 212, a display 216 that forms an interior space 217 together with the sidewall structure 212, and an internal frame 214 that faces the sidewall structure 212 and that is formed in the interior space 217. Here, the sidewall structure 212 may be referred to as the side member 140 of FIG. 3.

In the illustrated embodiment, the electronic device 100 may include the force key structure 200. The force key structure 200 may include a force key structure that detects a force applied to a key area 220 and controls the electronic device 100 to perform a function corresponding to the key area 220.

In the illustrated embodiment, the force key structure 200 may include the key area 220 formed on a surface of the sidewall structure 212 and a sensor assembly 230 disposed between the sidewall structure 212 and the internal frame 214, in which at least part of the sensor assembly 230 is aligned with the key area 220. The sensor assembly 230 may include a sensor 240 brought into contact with an inner surface 213 of the key area 220 and a support member 250 disposed between the sensor 240 and the internal frame 214.

In the illustrated embodiment, the sensor assembly 230 may be configured to sense a force applied to the key area 220. In various embodiments, the sensor assembly 230 may sense the force applied to the key area 220, based on displacement of the inner surface 213 that is opposite to the key area 220. The sensor assembly 230 may be disposed between the inner surface 213 of the key area 220 and a support surface 215 of the internal frame 214. The sensor assembly 230 may be press-fit into a space between the sidewall structure 212 and the internal frame 214. For example, the thickness W2 of the sensor assembly 230 may be greater than the distance W1 from the inner surface 213 of the key area 220 to the support surface 215 of the internal frame 214. Here, the thickness may refer to the shortest distance from the inner surface 213 to the support surface 215.

In various embodiments, the housing 210 may further include an adhesive area (not illustrated) for attaching the sensor assembly 230. The adhesive area (not illustrated) may be formed on the inner surface 213 of the sidewall structure 212 and together with the press-fit structure, may bring the sensor assembly 230 into close contact with the sidewall structure 212.

In various embodiments, the sensor assembly 230 may be disposed in a compressed state between the sidewall structure 212 and the internal frame 214.

In the illustrated embodiment, the sensor 240 may be configured to sense a force applied to the key area 220. The sensor 240 may have one surface that makes contact with the inner surface 213 of the sidewall structure 212 and an opposite surface that makes contact with the support member 250. The support member 250 may have elasticity. For example, the support member 250 may be compressed such that the sensor assembly 230 is press-fit between the sidewall structure 212 and the internal frame 214. For example, when the inner surface 213 of the key area 220 is bent toward the inside of the housing 210, the support member 250 may be compressed between the sensor 240 and the support surface 215 of the internal frame 214.

Referring to FIGS. 5A and 5B, the electronic device 100 may further include a seating structure 219 extending toward the internal frame 214 from the inner surface 213 of the sidewall structure 212 and an opening 2191 formed in the seating structure 219. The display 216 or a cover may be seated on the seating structure 219. The opening 2191 may be formed in a slit shape that is longer in the lengthwise direction than in the width direction (e.g., the direction from the inner surface 213 of the sidewall structure 212 to the support surface 215 of the internal frame 214). The opening 2191 may be formed to be at least partially aligned with the sensor 240. The opening 2191 may be formed such that pressure transmitted from the inner surface 213 of the sidewall structure 212 is transmitted to the sensor 240 without being dispersed to a surrounding structure (e.g., the housing 210).

Figure 6:
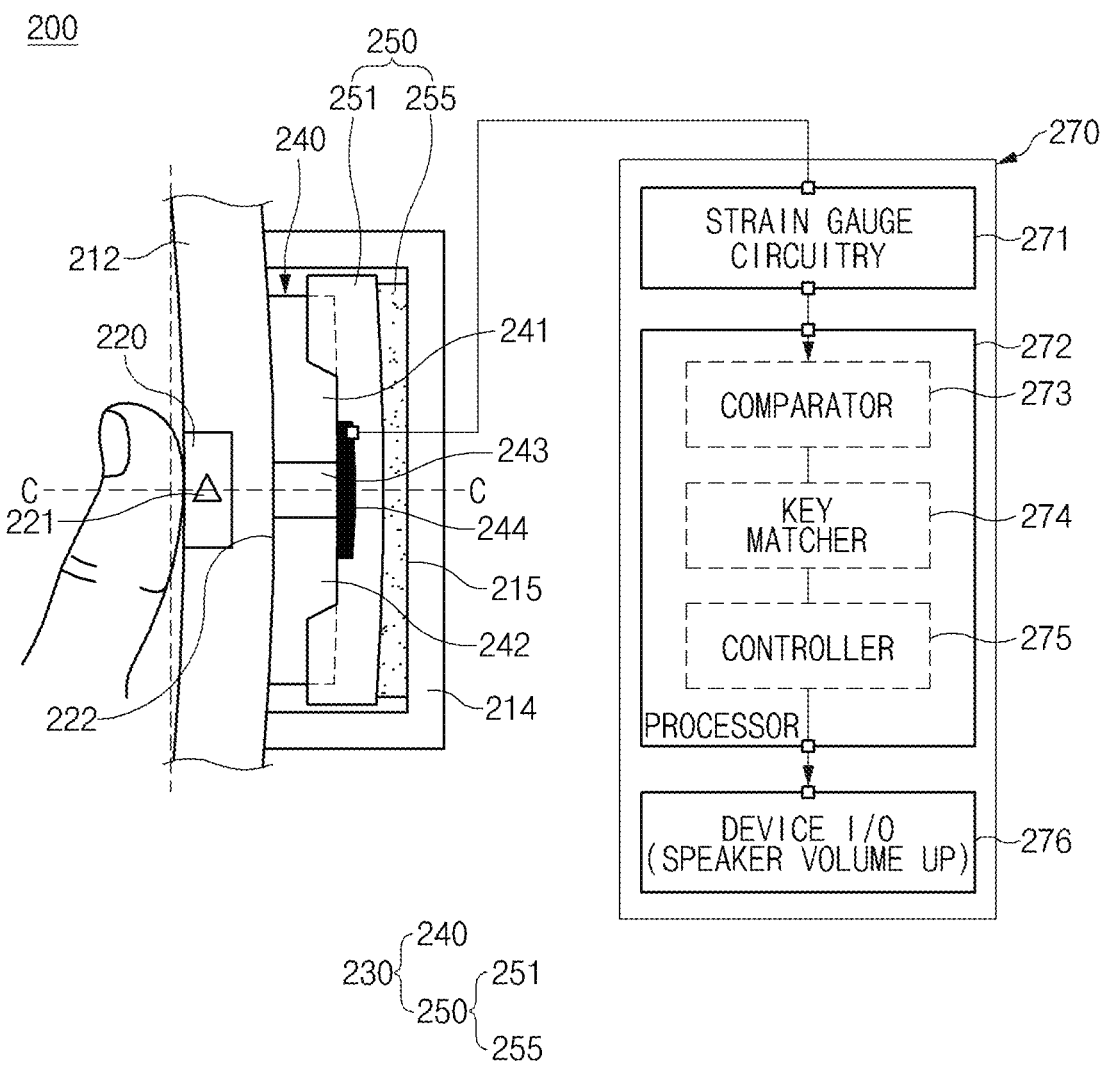
FIG. 6 illustrates a view of a force key structure of an electronic device and operation of the force key structure according to various embodiments.

FIG. 6 illustrates a view of a force key structure of an electronic device and operation of the force key structure according to various embodiments.

In the illustrated embodiment, the force key structure 200 may include a key area 220 formed on a surface of a housing 110, an internal frame 214 facing an inner surface 222 of the key area 220, a sensor assembly 230 disposed between the key area 220 and the internal frame 214, and control circuitry 270 electrically connected with the sensor assembly 230.

In the illustrated embodiment, the key area 220, which is an area formed on part of the surface of the housing 110, may include an area corresponding to a variable resistor 244. The key area 220 may include an area corresponding to a flexible portion 243 and may further include an area corresponding to at least a part of rigid portions 241 and 242 connected to the flexible portion 243.

In various embodiments, the force key structure 200 of the electronic device 100 may include a pressed state (e.g., the state shown by a dotted line in the drawing) in which the key area 220 is pressed toward the inside of the housing 110 and an equilibrium state (e.g., the state shown by a solid line in the drawing) in which the key area 220 is not pressed. The equilibrium state may include a state in which the pressed state is released so that the key area 220 is restored to the original state.

In various embodiments, the sensor assembly 230 may include a sensor 240 and a support member 250 that supports the sensor 240.

In various embodiments, the sensor 240 may include the first rigid portion 241, the second rigid portion 242 spaced apart from the first rigid portion 241 at a predetermined interval, the flexible portion 243 formed between the first rigid portion 241 and the second rigid portion 242, and the variable resistor 244 extending from the first rigid portion 241 to the second rigid portion 242. In some embodiments, the flexible portion 243 may include an air gap formed between the inner surface 222 of the key area 220 and the variable resistor 244.

In various embodiments, the first rigid portion 241 and the second rigid portion 242 may be disposed to be symmetric to each other with respect to a central axis C. The flexible portion 243 may be formed such that the central axis C passes through the center of the flexible portion 243.

In various embodiments, the variable resistor 244 may have opposite end portions formed on the first rigid portion 241 and the second rigid portion 242 and may extend into the flexible portion 243 so as to be electrically insulated from an elastic member 251. For example, the elastic member 251 may be formed of a metallic material, and the flexible portion 243 may be formed of an insulating material. The variable resistor 244 may be stretchable. The variable resistor 244 may be electrically connected with the control circuitry 270. The variable resistor 244 may extend across the central axis C. The variable resistor 244 may be formed to be symmetric with respect to the central axis C.

In various embodiments, the support member 250 may include the elastic member 251 that exerts an elastic force on the sensor 240, and a damping member 255 disposed between a support surface 215 of the internal frame 214 and the elastic member 251.

In various embodiments, the support member 250 may include only the damping member 255, exclusive of the elastic member 251. In this case, the sensor 240 may be attached to the inner surface 222 of the key area 220 by an adhesive member (e.g., a double-sided tape). The sensor 240 may be restored from the pressed state to the equilibrium state by an adhesive force of the adhesive member instead of an elastic force of the elastic member 251.

In various embodiments, the support member 250 may include only the damping member 255, exclusive of the elastic member 251. In this case, the internal frame 214 may be secured to the inner surface 222 of the key area 220 by a fastening member (e.g., a screw). The sensor 240 may be restored from the pressed state to the equilibrium state by a holding force exerted by the fastening member.

In various embodiments, the elastic member 251 may contain a metallic material. For example, the elastic member 251 may be formed in a thin plate shape such that portions making contact with the rigid portions 241 and 242 of the sensor 240 remain flat and a portion making contact with the flexible portion 243 of the sensor 240 has flexibility. That is, the elastic member 251 may include a thin metal plate that is formed of a metallic material and that has a small thickness.

In various embodiments, the damping member 255 may contain a cushioning material. In the equilibrium state, the damping member 255 may be disposed in a partly compressed state between the elastic member 251 and the support surface 215 of the internal frame 214.

In various embodiments, the elastic member 251 may contain a rigid material, but may be formed in a shape capable of exerting an elastic force. For example, the elastic member 251 may contain a rigid material, but may include a flexible member. The elastic member 251 may apply an immediate reaction force against an external force, compared to the damping member 255.

In various embodiments, the damping member 255 may contain a flexible material. For example, the damping member 255 may include a member capable of partly absorbing a force transmitted through the elastic member 251. For example, the damping member 255 may be formed in the form of foam.

In various embodiments, the electronic device 100 may include the control circuitry 270 configured to detect the magnitude of a force applied to the key area 220, based on a signal sensed by the sensor 240 and to control an input/output module 276 of the electronic device 100.

In various embodiments, the control circuitry 270 may include strain gauge circuitry 271 and a processor 272. In this case, the strain gauge circuitry 271 may include separate physical circuitry distinguished from the processor 272. The processor 272 may include a comparator 273, a key matcher 274, and a controller 275. The key matcher 274 and the controller 275 may be digital circuits that the processor 272 implements by executing instructions stored in a memory.

In various embodiments, the strain gauge circuitry 271 may be configured to measure a physical change between a plurality of segments included in the variable resistor 244. The strain gauge circuitry 271 may include various mechanisms. For example, strain gauge circuitry of a pressure sensitive type may be configured to measure a voltage change depending on a change in a physical parameter (e.g., the length or the cross-sectional area) of the variable resistor 244. In another example, strain gauge circuitry of a capacitive type may be configured to measure capacitance formed between a plurality of electrode sensors included in the variable resistor 244. In another example, strain gauge circuitry of a frequency resonance type may be configured to measure an inductance change between a plurality of electrodes included in the variable resistor 244.

In various embodiments, the strain gauge circuitry of a capacitive type and the strain gauge circuitry of a frequency resonance type may be configured such that a detection signal is radiated to the outside and the surface (e.g., the key area 220) of the housing 110 (e.g., a sidewall structure 212) In this case, the detection signal may be shielded by the housing 110 (e.g., the sidewall structure 212) that contains a metallic material. In the embodiment, the housing 110 (e.g., the sidewall structure 212) may include a polymer area formed on at least part of the key area 220. The polymer area may include an opening formed in part of the key area 220 and a polymer material injection-molded in the opening. In the embodiment, the detection signal may be radiated to the outside and the surface of the housing 110 (e.g., the sidewall structure 212) through the polymer area.

In various embodiments, a plurality of pieces of strain gauge circuitry 271 may be formed to correspond to the number of key areas 220 included in the force key structure 200. For example, the strain gauge circuitry 271 may include first strain gauge circuitry corresponding to a first structure (e.g., including the first key area 149*a* of FIG. 4 that is related to a volume-up function) and second strain gauge circuitry corresponding to a second structure (e.g., including the second key area 149*b* of FIG. 4 that is related to a volume-down function).

In various embodiments, the comparator 273 may be configured to determine whether a key (e.g., a key area) is pressed, by comparing a previously set reference voltage and the current voltage measured by the strain gauge circuitry 271. The reference voltage may refer to a voltage value applied to the variable resistor 244 in the equilibrium state. For example, when the current voltage is different from the reference voltage, the comparator 273 may determine that a force key is pressed.

In various embodiments, the comparator 273 may be configured to determine whether the key is pressed, by comparing the current voltage and a first reference voltage range. The first reference voltage range may have a predetermined range based on the reference voltage. When the current voltage is within the first reference voltage range, the comparator 273 may determine that the key is not pressed. For example, when the current voltage in the equilibrium state is within the first reference voltage range, the comparator 273 may determine that the key is not pressed. In another example, when the current voltage in the pressed state is above or below the first reference voltage range, the comparator 273 may determine that the key is pressed. That is, the first reference voltage range may be a voltage range, on the basis of which the equilibrium state is determined.

In various embodiments, the comparator 273 may be configured to determine whether the key is pressed, by additionally comparing the current voltage and a second reference voltage range. The second reference voltage range may include a voltage value greater than the upper limit voltage of the first reference voltage range. For example, when a transient impact (e.g., a drop impact) is applied to the electronic device 100 so that the current voltage exceeds the first reference voltage range and falls within the second reference voltage range, the comparator 273 may determine that the force key is not pressed. That is, when the current voltage is not within the first reference voltage range and the second reference voltage range, the comparator 273 may determine that the force key is pressed.

In various embodiments, the key matcher 274 may determine a gesture applied to the key area 220. For example, the key matcher 274 may determine whether the key area 220 is pressed for a short time, whether the key area 220 is pressed for a long time, whether the key area 220 is continuously pressed twice, or whether a finger is swiped over the key area 220. The key matcher 274 may transmit a signal to the controller 275 such that the controller 275 executes a function corresponding to the gesture.

In various embodiments, the controller 275 may execute an application corresponding to the gesture. The controller 275 may activate the input/output module 276 related to the function corresponding to the gesture. The controller 275 may provide a hazard warning corresponding to the gesture as needed. The controller 275 may execute a compensation algorithm for the sensor 240.

In various embodiments, the controller 275 may execute a functional module of the electronic device 100 that corresponds to a signal received from the key matcher 274. The functional module may include a haptic module containing a vibration motor. When the comparator 273 determines that the key is pressed, the haptic module may operate the vibration motor to inform a user that the key is pressed. For example, the controller 275 may execute at least one of a speaker module, a camera module, a display module, a microphone, and a Bluetooth module.

In the pressed state, the inner surface 222 of the key area 220 may press the sensor 240 toward the inside of the housing 110. At this time, the sensor 240 may be supported by the support member 250 and the internal frame 214 in the opposite direction to the pressing direction. For example, the elastic member 251 may exert an elastic force on the sensor 240 in the opposite direction to the pressing direction. Accordingly, the sensor 240 and the key area 220 may be restored from the pressed state to the equilibrium state.

In the pressed state, the first rigid portion 241 and the second rigid portion 242 of the sensor 240 may move away from the central axis C, and the flexible portion 243 may increase in volume. At this time, the variable resistor 244 included in the flexible portion 243 may increase in length. The variable resistor 244 may increase in length and may decrease in cross-sectional area. Accordingly, the resistance value of the variable resistor 244 may increase.

As the resistance value of the variable resistor 244 increases, a voltage value applied to the variable resistor 244 may vary. The strain gauge circuitry 271 may determine whether the key is pressed, by determining whether the current voltage formed in the variable resistor 244 is within the previously set first reference voltage range, based on the voltage value and may transmit a signal corresponding to an outcome of the determination to the processor 272. Based on the signal, the processor 272 may activate the input/output module 276 of the electronic device 100 that is related to the pressed key, or may execute an application.

Figure 7:
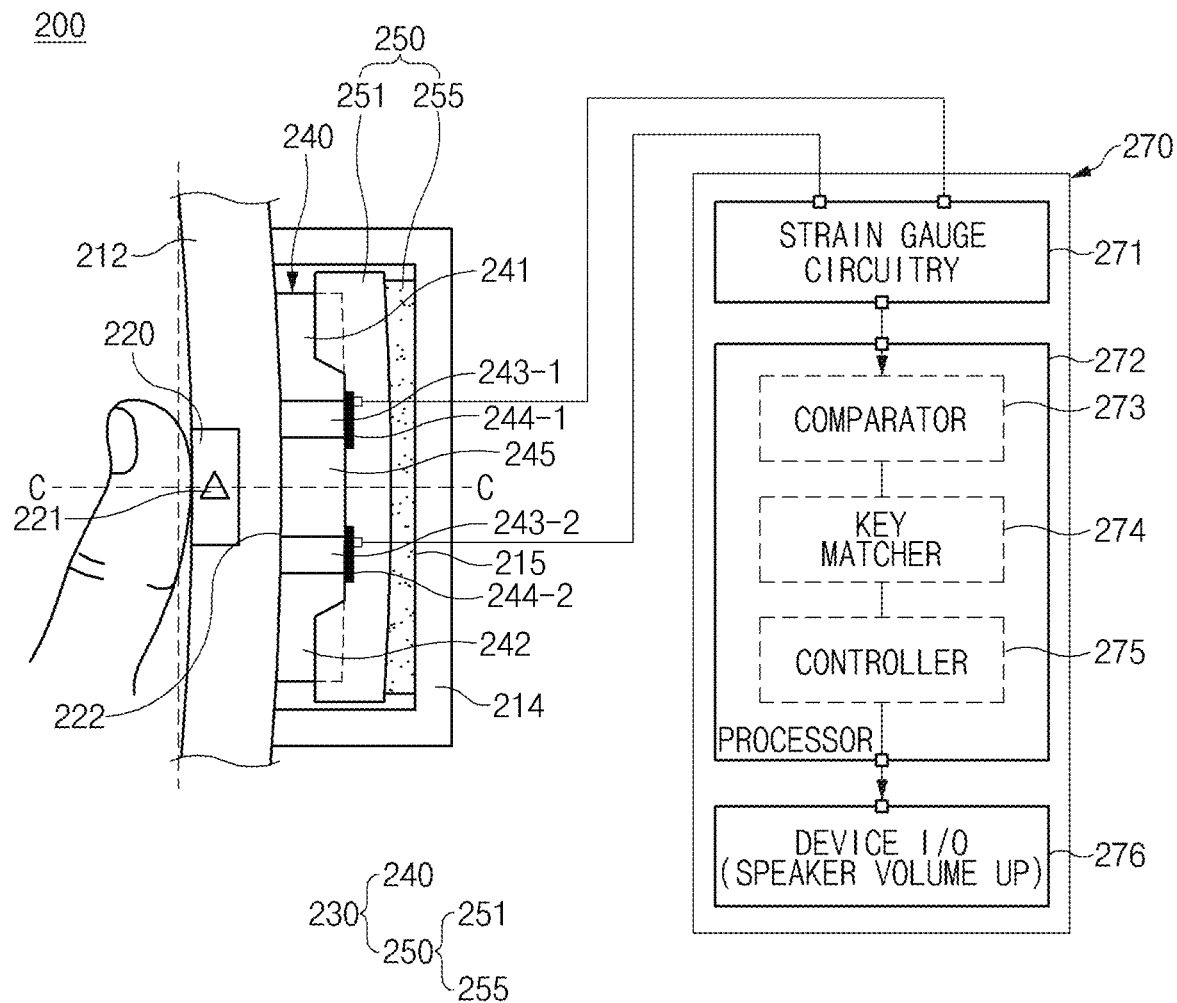
FIG. 7 illustrates a view of a force key structure of an electronic device according to various embodiments.

FIG. 7 illustrates a view of a force key structure of an electronic device according to various embodiments. Repetitive descriptions identical to ones given with regard to the embodiment illustrated in FIG. 6 will be omitted.

In the illustrated embodiment, a sensor 240 may include rigid portions 241, 242, 245 and flexible portions 243-1 and 243-2 between an inner surface 222 of a key area 220 and an elastic member 251. The rigid portions 241, 242, and 245 may include the first rigid portion 241, the second rigid portion 242 spaced apart from the first rigid portion 241, and the third rigid portion 245 disposed between the first rigid portion 241 and the second rigid portion 242. The flexible portions 243-1 and 243-2 may include the first flexible portion 243-1 disposed between the first rigid portion 241 and the third rigid portion 245, and the second flexible portion 243-2 disposed between the second rigid portion 242 and the third rigid portion 245. In this case, the third rigid portion 245 may be aligned with a center line C.

In various embodiments, the sensor 240 may include a first variable resistor 244-1 extending from the first rigid portion 241 to the third rigid portion 245 through the first flexible portion 243-1 and a second variable resistor 244-2 extending from the second rigid portion 242 to the third rigid portion 245 through the second flexible portion 243-2.

In various embodiments, the electronic device 100 may include control circuitry 270 configured to detect the magnitude of a force applied to the key area 220, based on a signal sensed by the sensor 240 and to control an input/output module 276 of the electronic device 100. The control circuitry 270 may include strain gauge circuitry 271 for detecting physical changes (e.g., length changes) of the first variable resistor 244-1 and the second variable resistor 244-2, and a processor 272 electrically connected with the strain gauge circuitry 271. The processor 272 may include a comparator 273, a key matcher 274, and a controller 275. The first variable resistor 244-1 and the second variable resistor 244-2 may be electrically connected to the strain gauge circuitry 271.

In various embodiments, the key matcher 274 may determine a swipe gesture applied to the key area 220. For example, when a voltage not equal to (greater or smaller than) a first reference voltage is applied to the second variable resistor 244-2 and thereafter a voltage not equal to (greater or smaller than) a second reference voltage is applied to the first variable resistor 244-1, the key matcher 274 may determine the swipe gesture to be a bottom-up swipe gesture. In another example, when a voltage not equal to (greater or smaller than) the first reference voltage is applied to the first variable resistor 244-1 and thereafter a voltage not equal to (greater or smaller than) the second reference voltage is applied to the second variable resistor 244-2, the key matcher 274 may determine the swipe gesture to be a top-down swipe gesture.

The force key structure 200 according to the illustrated embodiment may include the plurality of variable resistors 2441- and 244-2 corresponding to the single key area 220, thereby providing a swipe gesture input function to a user.

Figure 8:
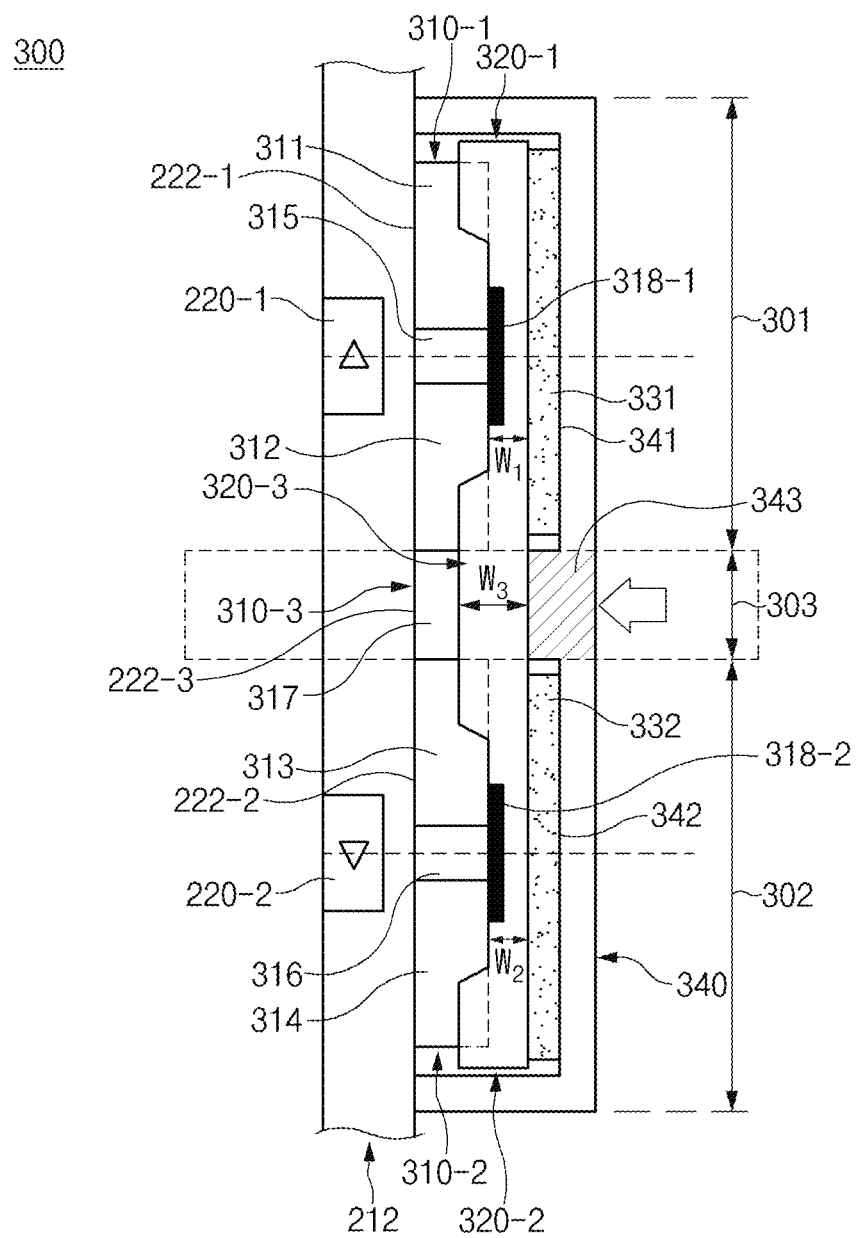
FIG. 8 illustrates a view of a force key structure of an electronic device according to various embodiments.

FIG. 8 illustrates a view of a force key structure of an electronic device according to various embodiments.

In various embodiments, the force key structure 300 may include a first structure 301 configured to detect a force applied to a first key area 220-1, a second structure 302 configured to detect a force applied to a second key area 220-2, and a third structure 303 formed between the first structure 301 and the second structure 302. In this case, the third structure 303 may be a structure that separates pressure applied to the first structure 301 and pressure applied to the second structure 302. For example, the third structure 303 may be configured such that pressure applied to one (e.g., the first structure 301) of the first structure 301 and the second structure 302 does not affect the other (e.g., the second structure 302). The third structure 303 may be a structure for independently detecting first displacement formed by the first key area 220-1 and second displacement formed by the second key area 220-2. In various embodiments, the third structure 303 may be a structure for separating operation of a first sensor structure 310-1 included in the first structure 301 and operation of a second sensor structure 310-2 included in the second structure 302.

In various embodiments, the first key area 220-1 may be formed on a surface of a sidewall structure 212. The first key area 220-1 may be formed in a position spaced apart from the second key area 220-2 at a predetermined interval.

In various embodiments, the second key area 220-2 may be formed on the surface of the sidewall structure 212. The second key area 220-2 may be formed in a position spaced apart from the first key area 220-1 at the predetermined interval.

In the illustrated embodiment, inner surfaces 222-1, 222-2, and 222-3 of the key areas 220-1 and 220-2 may include the first area 222-1 included in the first structure 301, the second area 222-2 included in the second structure 302, and the third area 222-3 included in the third structure 303. The first area 222-1 may make contact with the first sensor structure 310-1. The second area 222-2 may make contact with the second sensor structure 310-2. The third area 222-3 may make contact with the third sensor structure 310-3.

In various embodiments, a sensor 310 may extend from the first structure 301 to the second structure 302 through the third structure 303. The sensor 310 may include the first sensor structure 310-1 included in the first structure 301, the second sensor structure 310-2 included in the second structure 302, and the third sensor structure 310-3 included in the third structure 303.

In various embodiments, the sensor 310 may include a first sensor (e.g., the first sensor structure 310-1) and a separate second sensor (e.g., the second sensor structure 310-2) that is spaced apart from the first sensor. For example, an air gap (e.g., the third sensor structure 310-3) may be formed between the first sensor and the second sensor. In this case, the first sensor and the second sensor may each be referred to as the sensor 240 illustrated in FIG. 6.

In various embodiments, the first sensor structure 310-1 may be formed to be at least partially aligned with the first key area 220-1 to sense a force applied to the first key area 220-1. The first sensor structure 310-1 may be supported by a first elastic portion 320-1 of an elastic member 320. For example, the first sensor structure 310-1 may be formed such that a first flexible portion 315 is aligned with the first key area 220-1.

In various embodiments, the second sensor structure 310-2 may be formed to be at least partially aligned with the second key area 220-2 to sense a force applied to the second key area 220-2. The second sensor structure 310-2 may be supported by a second elastic portion 320-2 of the elastic member 320. For example, the second sensor structure 310-2 may be formed such that a second flexible portion 316 is aligned with the second key area 220-2.

In various embodiments, the third sensor structure 310-3 may be formed between the first sensor structure 310-1 and the second sensor structure 310-2 to distinguish between a force sensed by the first sensor structure 310-1 and a force sensed by the second sensor structure 310-2. The third sensor structure 310-3 may be supported by a third elastic portion 320-3 of the elastic member 320. For example, the third sensor structure 310-3 may be formed of a flexible material. For example, the third sensor structure 310-3 may include an air gap formed between a second rigid portion 312 of the first sensor structure 310-1 and a third rigid portion 313 of the second sensor structure 310-2.

In the illustrated embodiment, the first sensor structure 310-1 may include a first rigid portion 311, the second rigid portion 312, and the first flexible portion 315. The first flexible portion 315 may be formed between the first rigid portion 311 and the second rigid portion 312. The first flexible portion 315 may include a first variable resistor 318-1. The first variable resistor 318-1 may have opposite end portions that overlap the first rigid portion 311 and the second rigid portion 312, respectively, and may be formed across the first flexible portion 315 from the first rigid portion 311 to the second rigid portion 312.

In the illustrated embodiment, the second sensor structure 310-2 may include the third rigid portion 313, a fourth rigid portion 314, and the second flexible portion 316. The second flexible portion 316 may be formed between the third rigid portion 313 and the fourth rigid portion 314. The second flexible portion 316 may include a second variable resistor 318-2. The second variable resistor 318-2 may have opposite end portions that overlap the third rigid portion 313 and the fourth rigid portion 314, respectively, and may be formed across the second flexible portion 316 from the third rigid portion 313 to the fourth rigid portion 314.

In the illustrated embodiment, the elastic member 320 may extend from the first structure 301 to the second structure 302 through the third structure 303. The elastic member 320 may include the first elastic portion 320-1 included in the first structure 301, the second elastic portion 320-2 included in the second structure 302, and the third elastic portion 320-3 included in the third structure 303. The first elastic portion 320-1 may support the first rigid portion 311, the second rigid portion 312, and the first flexible portion 315. The second elastic portion 320-2 may support the third rigid portion 313, the fourth rigid portion 314, and the second flexible portion 316.

In the illustrated embodiment, an internal frame 340 may include a first support surface 341 included in the first structure 301, a second support surface 342 included in the second structure 302, and a protrusion 343 included in the third structure 303. The first support surface 341 may support a first damping member 331. The second support surface 342 may support a second damping member 332. The protrusion 343 may protrude between the first damping member 331 and the second damping member 332 to separate compression of the first damping member 331 and compression of the second damping member 332. The protrusion 343 may support the third elastic portion 320-3 of the elastic member 320. At this time, the protrusion 343 may support the third elastic portion 320-3 such that a surface of the third elastic portion 320-3 remains flat. Accordingly, the third elastic portion 320-3 may be formed such that bending of one of the first elastic portion 320-1 and the second elastic portion 320-2 does not affect the other.

The force key structure 300 disclosed herein may include the third structure 303 for distinguishing between operations of the first structure 301 and the second structure 302 adjacent to each other. The third structure 303 may include the protrusion 343 of the internal frame 340, the third elastic portion 320-3 of the elastic member 320, and the third sensor structure 310-3 of the sensor 310.

The protrusion 343 may allow compression of one of the first damping member 331 and the second damping member 332 not to affect the other. Accordingly, operation of the first structure 301 and operation of the second structure may be distinguished from each other.

The third elastic portion 320-3 may be formed to be thicker than the first elastic portion 320-1 and the second elastic portion 320-2. The first elastic portion 320-1 may be formed such that the portion supporting the first flexible portion 315 has a first thickness W1, and the second elastic portion 320-2 may be formed such that the portion supporting the second flexible portion 316 has a second thickness W2. In this case, the third elastic portion 320-3 may have a third thickness W3 greater than the first thickness W1 and the second thickness W2.

In various embodiments, the first elastic portion 320-1 and the second elastic portion 320-2 may be at least partially bent depending on a shift from an equilibrium state to a pressed state, and the bent portions may be restored depending on a shift to the equilibrium state again. In this case, the third elastic portion 320-3 may have a higher modulus of elasticity than the other portions of the elastic member 320 because the third elastic portion 320-3 is formed to be thicker than the other portions (e.g., the first elastic portion 320-1 and the second elastic portion 320-2). For example, when the first key area 220-1 is pressed, at least part of the first elastic portion 320-1 may be convexly bent toward the inside of the housing, and the thicker third elastic portion 320-3 may be less bent than the first elastic portion 320-1 or may not be bent. Accordingly, the second elastic portion 320-2 connected to the third elastic portion 320-3 may not be affected by the bending of the first elastic portion 320-1. As described above, the third elastic portion 320-3 may be formed to be thicker than the other portions such that bending of one of the first elastic portion 320-1 and the second elastic portion 320-2 does not affect the other.

The third sensor structure 310-3 may include the air gap formed between the second rigid portion 312 included in the first sensor structure 310-1 and the third rigid portion 313 included in the second sensor structure 310-2. Accordingly, pressing of one of the first sensor structure 310-1 and the second sensor structure 310-2 may not affect the other.

Figure 9:
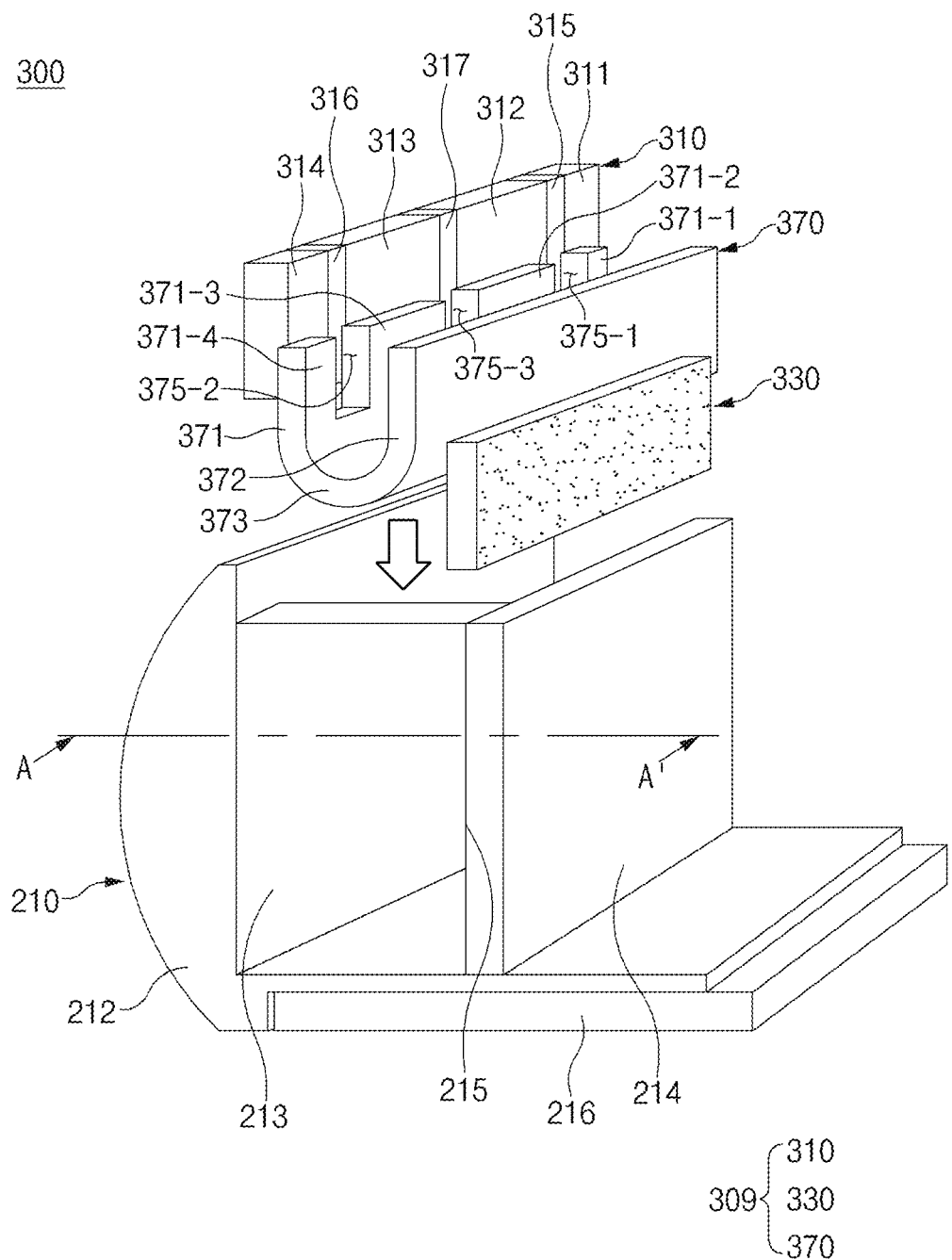
FIG. 9 illustrates an exploded perspective view of a force key structure of an electronic device according to various embodiments.
Figure 10:
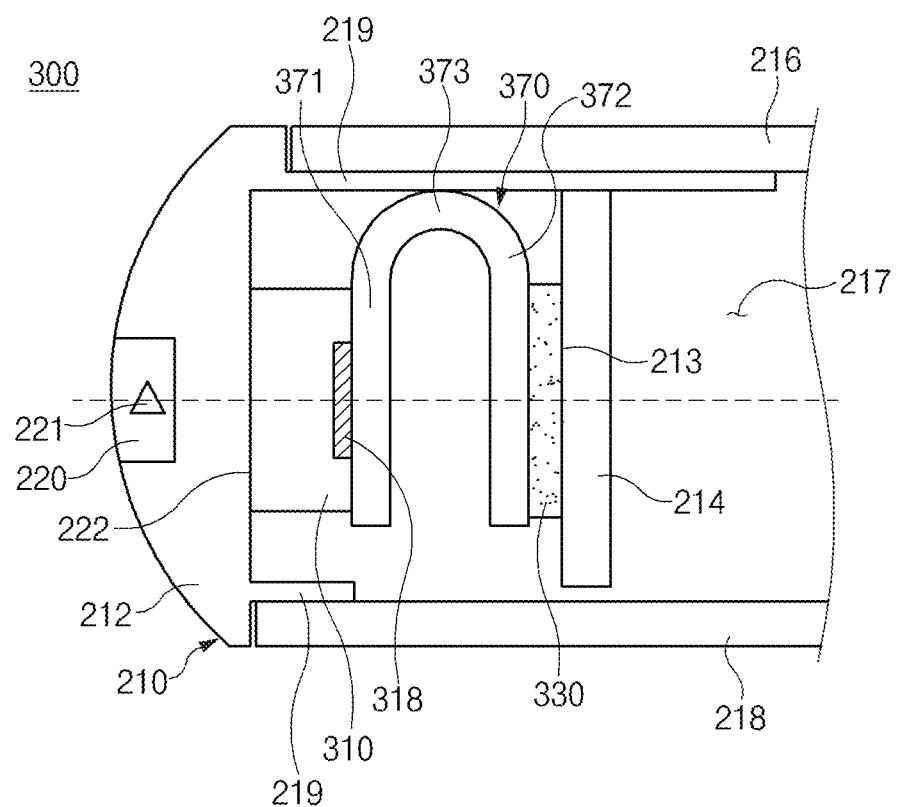
FIG. 10 illustrates a sectional view of the force key structure taken along line A-A' of FIG. 9.

FIG. 9 illustrates an exploded perspective view of a force key structure of an electronic device according to various embodiments. FIG. 10 illustrates a sectional view of the force key structure taken along line A-A' of FIG. 9.

In the illustrated embodiment, a sensor assembly 309 may be disposed between an inner surface 213 of a sidewall structure 212 and a support surface 215 of an internal frame 214. The sensor assembly 309 may be press-fit into a space between the sidewall structure 212 and the internal frame 214. For example, the thickness of the sensor assembly 309 may be greater than the distance from the inner surface 213 of the sidewall structure 212 to the support surface 215 of the internal frame 214. Here, the thickness may refer to a length measured in a direction in which the shortest distance from the inner surface 213 to the support surface 215 is formed. For example, the sensor assembly 309 may be disposed in a compressed state between the sidewall structure 212 and the internal frame 214.

In the illustrated embodiment, the sensor assembly 309 may include a sensor 310, an elastic member 370 that supports the sensor 310, and a damping member 330 disposed between the elastic member 370 and the internal frame 214. The sensor 310 may be supported by the elastic member 370 in an opposite direction to a pressing direction.

In the illustrated embodiment, the sensor 310 may include a first rigid portion 311, a second rigid portion 312, a third rigid portion 313, and a fourth rigid portion 314. The first rigid portion 311 may be at least partially supported by an extension 1-1 371-1 of the elastic member 370. The second rigid portion 312 may be at least partially supported by an extension 1-2 371-2 of the elastic member 370. The third rigid portion 313 may be at least partially supported by an extension 1-3 371-3 of the elastic member 370. The fourth rigid portion 314 may be at least partially supported by an extension 1-4 371-4 of the elastic member 370.

In the illustrated embodiment, the sensor 310 may include a first flexible portion 315 formed between the first rigid portion 311 and the second rigid portion 312, a second flexible portion 316 formed between the third rigid portion 313 and the fourth rigid portion 314, and a third flexible portion 317 formed between the second rigid portion 312 and the third rigid portion 313.

In the illustrated embodiment, the first flexible portion 315 may be disposed to be at least partially aligned with a first slit 375-1 of the elastic member 370. The first flexible portion 315 may include a first variable resistor (e.g., the first variable resistor 318-1 of FIG. 7) inside. The first variable resistor (e.g., the first variable resistor 318-1 of FIG. 7) may extend such that opposite end portions thereof are located on the first rigid portion 311 and the second rigid portion 312. When a portion (e.g., the first key area 220-1 of FIG. 7) of the sidewall structure 212 that corresponds to the first flexible portion 315 is pressed, the first flexible portion 315 may be bent such that at least part thereof is received in the first slit 375-1. At this time, the first variable resistor (e.g., the first variable resistor 318-1 of FIG. 7) may increase in length and may decrease in cross-sectional area.

In the illustrated embodiment, the second flexible portion 316 may be disposed to be at least partially aligned with a second slit 375-2 of the elastic member 370. The second flexible portion 316 may include a second variable resistor (e.g., the second variable resistor 318-2 of FIG. 7) inside. The second variable resistor (e.g., the second variable resistor 318-2 of FIG. 7) may extend such that opposite end portions thereof are located on the third rigid portion 313 and the fourth rigid portion 314. When a portion (e.g., the second key area 220-2 of FIG. 7) of the sidewall structure 212 that corresponds to the second flexible portion 316 is pressed, the second flexible portion 316 may be bent such that at least part thereof is received in the second slit 375-2. At this time, the second variable resistor (e.g., the second variable resistor 318-2 of FIG. 7) may increase in length and may decrease in cross-sectional area.

In the illustrated embodiment, the third flexible portion 317 may be disposed to be at least partially aligned with a third slit 375-3 of the elastic member 370. When the sidewall structure 212 (e.g., a first key area (e.g., the first key area 220-1 of FIG. 7) or a second key area (e.g., the second key area 220-2 of FIG. 7)) is pressed, the third flexible portion 317 may be bent such that at least part thereof is received in the third slit 375-3. When one of the first flexible portion 315 and the second flexible portion 316 is bent, the third flexible portion 317 may remove, between the first flexible portion 315 and the second flexible portion 316, an effect of the bending such that the bending does not affect the other. For example, when the first rigid portion 311 and the second rigid portion 312 are pressed toward the internal frame 214 and at least part of the first flexible portion 315 is bent into the first slit 375-1, the third flexible portion 317 connected to the second rigid portion 312 may be bent in the opposite direction. Accordingly, the second flexible portion 316 may not be bent into the second slit 375-2.

In the illustrated embodiment, the elastic member 370 may include a first extension 371 facing the inner surface 213 of the sidewall structure 212, a second extension 372 facing the support surface 215 of the internal frame 214, and a curved portion 373 that connects the first extension 371 and the second extension 372 and that is formed to be a curved surface. For example, the elastic member 370 may be substantially U-shaped.

In the illustrated embodiment, the first extension 371 may be brought into contact with the sensor 310. The first extension 371 may be spaced apart from the second extension 372 at a predetermined interval. The first extension 371 may move toward the internal frame 214 in a pressed state and may move back toward the sidewall structure 212 in an equilibrium state. Accordingly, the first extension 371 may exert an elastic force on the sensor 310. The second extension 372 may be supported by the damping member 330.

In the illustrated embodiment, the first extension 371 may include the extension 1-1 371-1, the extension 1-2 371-2, the extension 1-3 371-3, and the extension 1-4 371-4. The first slit 375-1 may be formed between the extension 1-1 371-1 and the extension 1-2 371-2, the second slit 375-2 may be formed between the extension 1-3 371-3 and the extension 1-4 371-4, and the third slit 375-3 may be formed between the extension 1-2 371-2 and the extension 1-3 371-3.

In various embodiments, the extension 1-1 371-1 may support at least part of the first rigid portion 311 of the sensor 310. When the sensor 310 is pressed, the extension 1-1 371-1, together with the first rigid portion 311 of the sensor 310, may move toward the second extension 372.

In various embodiments, the extension 1-2 371-2 may support at least part of the second rigid portion 312 of the sensor 310. When the sensor 310 is pressed, the extension 1-2 371-2, together with the second rigid portion 312 of the sensor 310, may move toward the second extension 372.

In various embodiments, the extension 1-3 371-3 may support at least part of the third rigid portion 313 of the sensor 310. When the sensor 310 is pressed, the extension 1-3 371-3, together with the third rigid portion 313 of the sensor 310, may move toward the second extension 372.

In various embodiments, the extension 1-4 371-4 may support at least part of the fourth rigid portion 314 of the sensor 310. When the sensor 310 is pressed, the extension 1-4 371-4, together with the fourth rigid portion 314 of the sensor 310, may move toward the second extension 372.

In the illustrated embodiment, the damping member 330 may be disposed between the second extension 372 of the elastic member 370 and the support surface 215 of the internal frame 214. In an equilibrium state, the damping member 330 may be disposed in a compressed state between the second extension 372 of the elastic member 370 and the support surface 215 of the internal frame 214 such that the sensor 310 and the elastic member 370 are press-fit between the sidewall structure 212 and the internal frame 214. The damping member 330 may be more compressed in the pressed state than in the equilibrium state.

Referring to FIG. 10, a housing 210 may include the sidewall structure 212, a display 216, a cover 218, and a seating structure 219 on which the display 216 and the cover 218 are seated. The seating structure 219 may extend from the sidewall structure 212. The sidewall structure 212, the display 216, and the cover 218 may form an interior space 217 of the housing 210. In this case, the sensor 310, the elastic member 370, and the damping member 330 may be disposed in the interior space 217.

In the illustrated embodiment, the elastic member 370 may be formed such that the curved portion 373 supports the seating structure 219.

Figure 11:
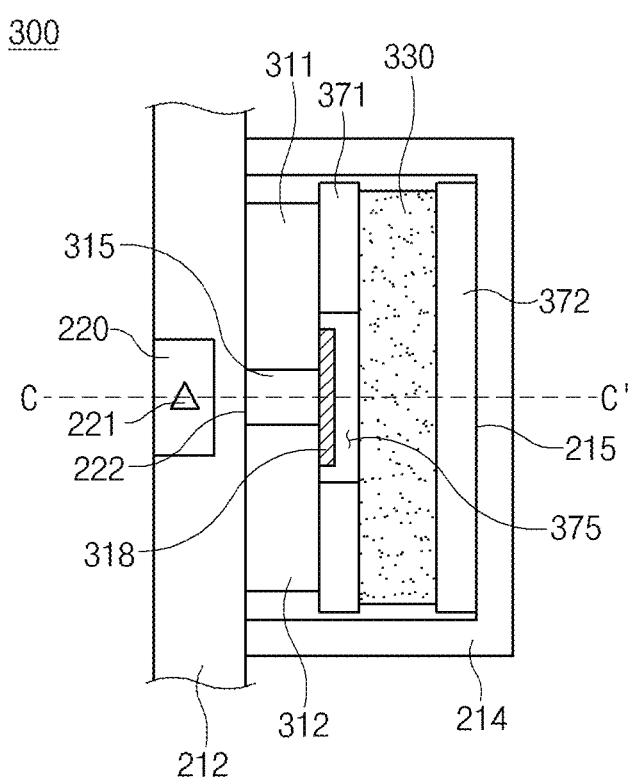
FIG. 11 illustrates a view of a force key structure of an electronic device according to various embodiments.
Figure 12:
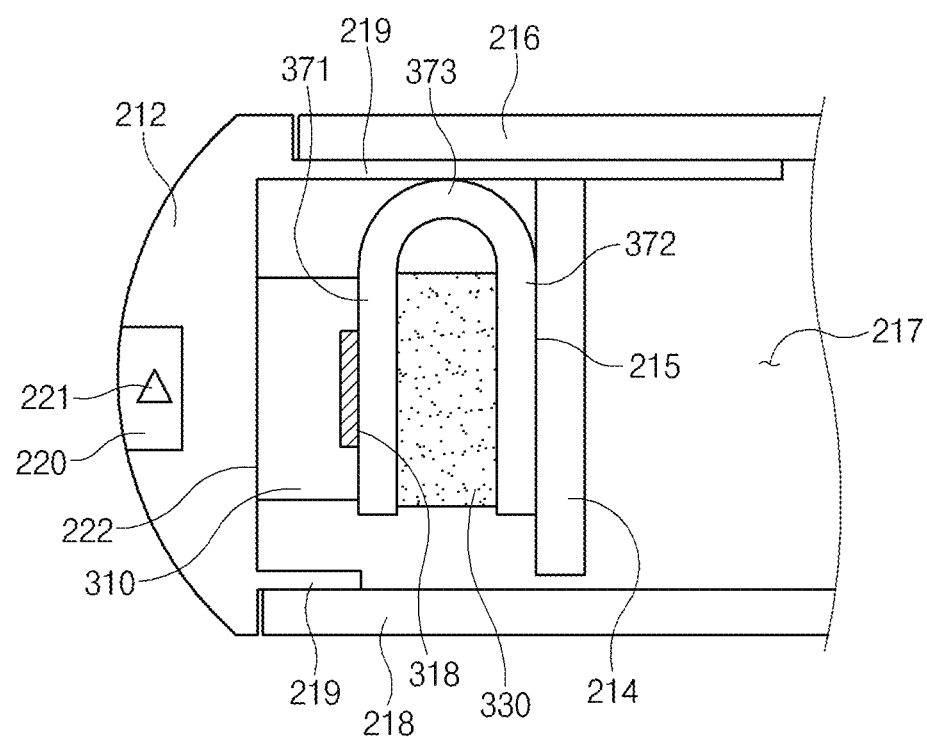
FIG. 12 illustrates a sectional view taken along line C-C' of FIG. 11.

FIG. 11 illustrates a view of a force key structure of an electronic device according to various embodiments. FIG. 12 illustrates a sectional view taken along line C-C' of FIG. 11.

Referring to FIGS. 11 and 12, the electronic device may include a housing 210 that includes a sidewall structure 212 and a display 216, and the force key structure 300 for detecting a force applied to part of the sidewall structure 212. In this case, the sidewall structure 212 and the display 216 may form surfaces of the electronic device and may form an interior space 217. An internal frame 214 may be formed in the interior space 217. The internal frame 214 may face the sidewall structure 212.

In the illustrated embodiment, the force key structure 300 may include a key area 220 formed on the sidewall structure 212, the internal frame 214 opposite the sidewall structure 212, and a sensor assembly 309 disposed between the internal frame 214 and the sidewall structure 212. Here, the sidewall structure 212 may include a structure that forms a surface of the housing 210 of the electronic device, and the internal frame 214 may include an internal structure of the housing 210 of the electronic device.

In the illustrated embodiment, the key area 220 may include an indicator area 221. For example, the indicator area 221 may be formed in a shape in which a volume control function of the electronic device is designed.

In the illustrated embodiment, the force key structure 300 may include a sensor 310 configured to sense a force applied to the key area 220, an elastic member 370 that exerts an elastic force on the sensor 310, and a damping member 330 that supports the elastic member 370.

In the illustrated embodiment, the sensor 310 may include a first rigid portion 311, a second rigid portion 312, and a flexible portion 315 formed between the first rigid portion 311 and the second rigid portion 312.

In various embodiments, the first rigid portion 311 may be spaced apart from the second rigid portion 312 at a predetermined interval. The first rigid portion 311 may make contact with an inner surface 213 of the sidewall structure 212. Part of the first rigid portion 311 that is adjacent to the flexible portion 315 may be partly aligned with a slit 375 formed in the elastic member 370. The first rigid portion 311 may be formed of a rigid material and may not be bent in a pressed state. In the pressed state, the first rigid portion 311 may press an extension 1-1 371-1 of the elastic member 370 toward the internal frame 214.

In various embodiments, the second rigid portion 312 may be spaced apart from the first rigid portion 311 at the predetermined interval. The second rigid portion 312 may make contact with the inner surface 213 of the sidewall structure 212. Part of the second rigid portion 312 that is adjacent to the flexible portion 315 may be partly aligned with the slit 375 formed in the elastic member 370. The second rigid portion 312 may be formed of a rigid material and may not be bent in a pressed state. In the pressed state, the second rigid portion 312 may press an extension 1-2 371-2 of the elastic member 370 toward the internal frame 214.

In various embodiments, the flexible portion 315 may be formed of a flexible material. In a pressed state, at least part of the flexible portion 315 may be received in the slit 375. The flexible portion 315 may include a variable resistor 318 inside. The variable resistor 318 may have one end portion located on the first rigid portion 311 and an opposite end portion located on the second rigid portion 312. The variable resistor 318 may be stretchable in the lengthwise direction. In the pressed state, the flexible portion 315 may increase in volume or length such that at least part thereof is received in the slit 375. In this case, the variable resistor 318 becomes longer than in an equilibrium state. Accordingly, the cross-sectional area of the variable resistor 318 may decrease, and the resistance value of the variable resistor 318 may increase. In the pressed state, a portion of the variable resistor 318 that is included in the flexible portion 315 may increase in length and may decrease in cross-sectional area.

Referring to FIG. 12, the elastic member 370 may include a first extension 371, a second extension 372, and a curved portion 373 that connects the first extension 371 and the second extension 372. The elastic member 370 may be substantially U-shaped. The first extension 371 may include the extension 1-1 371-1 making contact with part of the first rigid portion 311, the extension 1-2 371-2 making contact with part of the second rigid portion 312, and the slit 375 formed between the extension 1-1 371-1 and the extension 1-2 371-2.

In various embodiments, in a pressed state, the curved portion 373 of the elastic member 370 may be more bent than in an equilibrium state. At this time, the extension 1-1 371-1 and the extension 1-2 371-2 may move toward the second extension 372. As the pressure is released, the curved portion 373 may be restored to the equilibrium state, and the extension 1-1 371-1 and the extension 1-2 371-2 may exert an elastic force in an opposite direction to the direction of the pressure applied to the sensor 310. In the pressed state, the extension 1-1 371-1 may exert an elastic force on the first rigid portion 311 of the sensor 310 in the opposite direction to the pressing direction. In the pressed state, the extension 1-2 371-2 may exert an elastic force on the second rigid portion 312 of the sensor 310 in the opposite direction to the pressing direction.

In various embodiments, the slit 375 may be formed in a position that corresponds to the flexible portion 315 and parts of the rigid portions 311 and 312 that are adjacent to the flexible portion 315. In some embodiments, the slit 375 may be formed to be longer than the variable resistor 318.

Referring to FIG. 12, the damping member 330 may be disposed between the first extension 371 and the second extension 372 of the elastic member 370. The damping member 330 may be press-fit between the first extension 371 and the second extension 372. In an equilibrium state, the damping member 330 may be disposed in a compressed state between the first extension 371 and the second extension 372. When in a pressed state, the elastic member 370 is pressed toward the internal frame 214, the curved portion 373 may be bent such that the first extension 371 moves toward the second extension 372. At this time, the second extension 372 may remain flat by a support surface 215 of the internal frame 214.

Referring to FIG. 12, the sidewall structure 212 may further include a seating structure 219 on which the display 216 is seated. The seating structure 219 may extend from the sidewall structure 212 toward the inside of the housing 210. In this case, the elastic member 370 may be disposed such that the curved portion 373 supports the seating structure 219.

Figure 13:
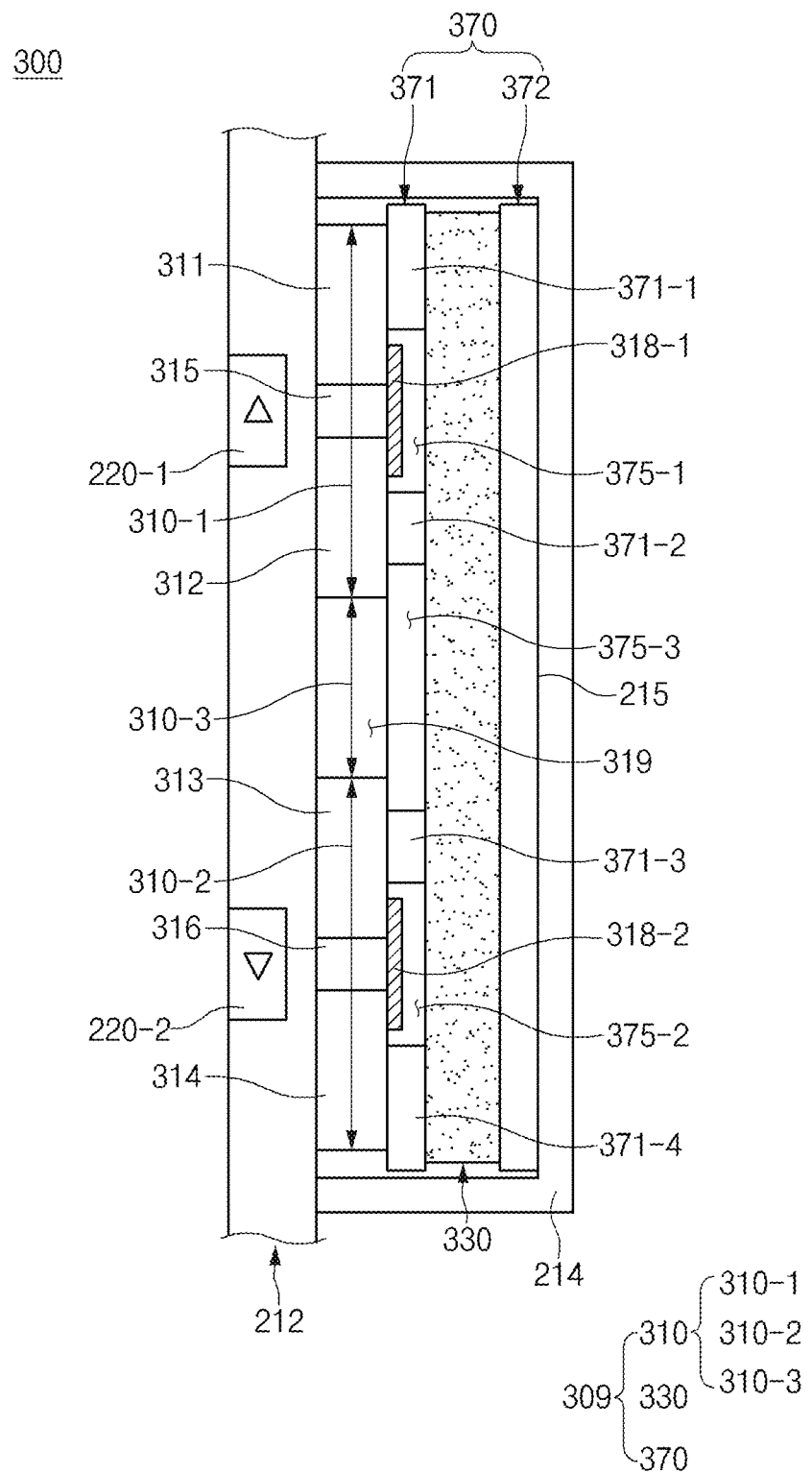
FIG. 13 illustrates a view of a force key structure of an electronic device according to various embodiments.

FIG. 13 illustrates a view of a force key structure of an electronic device according to various embodiments.

Referring to FIG. 13, the force key structure 300 may include a first key area 220-1 and a second key area 220-2 formed on a sidewall structure 212, and a sensor assembly 309 disposed between the sidewall structure 212 and an internal frame 214. The sensor assembly 309 may be press-fit between the internal frame 214 and the sidewall structure 212.

In various embodiments, the sensor assembly 309 may include a first sensor structure 310-1 that supports an inner surface of the first key area 220-1 and a second sensor structure 310-2 that supports an inner surface of the second key area 220-2. The first sensor structure 310-1 may be configured to sense a force applied to the first key area 220-1. The second sensor structure 310-2 may be configured to sense a force applied to the second key area 220-2.

In various embodiments, the first sensor structure 310-1 may include a first rigid portion 311, a second rigid portion 312, and a first flexible portion 315 including a first variable resistor 318-1 inside. The first variable resistor 318-1 may have one end portion formed on the first rigid portion 311 and an opposite end portion formed on the second rigid portion 312 through the first flexible portion 315. The first rigid portion 311 may be disposed between an inner surface 213 of the sidewall structure 212 and an extension 1-1 371-1 of an elastic member 370. Part of the first rigid portion 311 may be aligned with a first slit 375-1 of the elastic member 370. In a pressed state, the part of the first rigid portion 311, which is aligned with the first slit 375-1, may be partly moved into the first slit 375-1. The second rigid portion 312 may be disposed between the inner surface 213 of the sidewall structure 212 and an extension 1-2 371-2 of the elastic member 370. Part of the second rigid portion 312 may be aligned with the first slit 375-1 of the elastic member 370. In the pressed state, the part of the second rigid portion 312, which is aligned with the first slit 375-1, may be partly moved into the first slit 375-1.

In various embodiments, the second sensor structure 310-2 may include a third rigid portion 313, a fourth rigid portion 314, and a second flexible portion 316 including a second variable resistor 318-2 inside. The second variable resistor 318-2 may have one end portion formed on the third rigid portion 313 and an opposite end portion formed on the fourth rigid portion 314 through the second flexible portion 316. The third rigid portion 313 may be disposed between the inner surface 213 of the sidewall structure 212 and an extension 1-1 371-3 of the elastic member 370. Part of the third rigid portion 313 may be aligned with a second slit 375-2 of the elastic member 370. In a pressed state, the part of the third rigid portion 313, which is aligned with the second slit 375-2, may be partly moved into the second slit 375-2. The fourth rigid portion 314 may be disposed between the inner surface 213 of the sidewall structure 212 and an extension 1-4 371-4 of an elastic member 370. Part of the fourth rigid portion 314 may be aligned with the second slit 375-2 of the elastic member 370. In the pressed state, the part of the fourth rigid portion 314, which is aligned with the second slit 375-2, may be partly moved into the second slit 375-2.

In various embodiments, an air gap 319 may be formed between the first sensor structure 310-1 and the second sensor structure 310-2. The first sensor structure 310-1 and the second sensor structure 310-2 may be spaced apart from each other at a predetermined interval. In this case, the interval may be smaller than the interval between the extension 1-2 371-2 and the extension 1-3 371-3 of the elastic member 370.

In various embodiments, the elastic member 370 may include a first extension 371, a second extension 372, and a curved portion 373 that connects the first extension 371 and the second extension 372. In this case, the curved portion 373 may be referred to as the curved portion 373 of FIG. 9. A damping member 330 may be disposed between the first extension 371 and the second extension 372. The second extension 372 may remain flat by being supported by the internal frame 214. In a pressed state, the first extension 371 may be moved close to the second extension 372 by bending of the curved portion 373.

In various embodiments, the first extension 371 may include the extension 1-1 371-1, the extension 1-2 371-2, the extension 1-3 371-3, and the extension 1-4 371-4. The first slit 375-1 may be formed between the extension 1-1 371-1 and the extension 1-2 371-2. The second slit 375-2 may be formed between the extension 1-3 371-3 and the extension 1-4 371-4. A third slit 375-3 may be formed between the extension 1-2 371-2 and the extension 1-3 371-3.

In the illustrated embodiment, the extension 1-1 371-1 may be disposed between the first rigid portion 311 of the sensor 310 and the damping member 330. When moved from a pressed state to an equilibrium state, the extension 1-1 371-1 may press the first rigid portion 311 of the sensor 310 in the opposite direction to the pressing direction. The extension 1-2 371-2 may be disposed between the second rigid portion 312 of the sensor 310 and the damping member 330. When moved from the pressed state to the equilibrium state, the extension 1-2 371-2 may press the second rigid portion 312 of the sensor 310 in the opposite direction to the pressing direction. The extension 1-3 371-3 may be disposed between the third rigid portion 313 of the sensor 310 and the damping member 330. When moved from the pressed state to the equilibrium state, the extension 1-3 371-3 may press the third rigid portion 313 of the sensor 310 in the opposite direction to the pressing direction. The extension 1-4 371-4 may be disposed between the fourth rigid portion 314 of the sensor 310 and the damping member 330. When moved from the pressed state to the equilibrium state, the extension 1-4 371-4 may press the fourth rigid portion 314 of the sensor 310 in the opposite direction to the pressing direction.

In the illustrated embodiment, the first slit 375-1 may be formed in a position corresponding to the first flexible portion 315. In this case, the length of the first slit 375-1 (e.g., the distance between the extension 1-1 371-1 and the extension 1-2 371-2) may be greater than the length of the first flexible portion 315 (e.g., the distance between the first rigid portion 311 and the second rigid portion 312). The second slit 375-2 may be formed in a position corresponding to the second flexible portion 316. In this case, the length of the second slit 375-2 (e.g., the distance between the extension 1-3 371-3 and the extension 1-4 371-4) may be greater than the length of the second flexible portion 316 (e.g., the distance between the third rigid portion 313 and the fourth rigid portion 314). The third slit 375-3 may be formed in a position corresponding to the air gap 319 of the sensor 310. In this case, the length of the third slit 375-3 (e.g., the distance between the extension 1-2 371-2 and the extension 1-3 371-3) may be greater than the distance between the second rigid portion 312 and the third rigid portion 313.

Figure 14A:
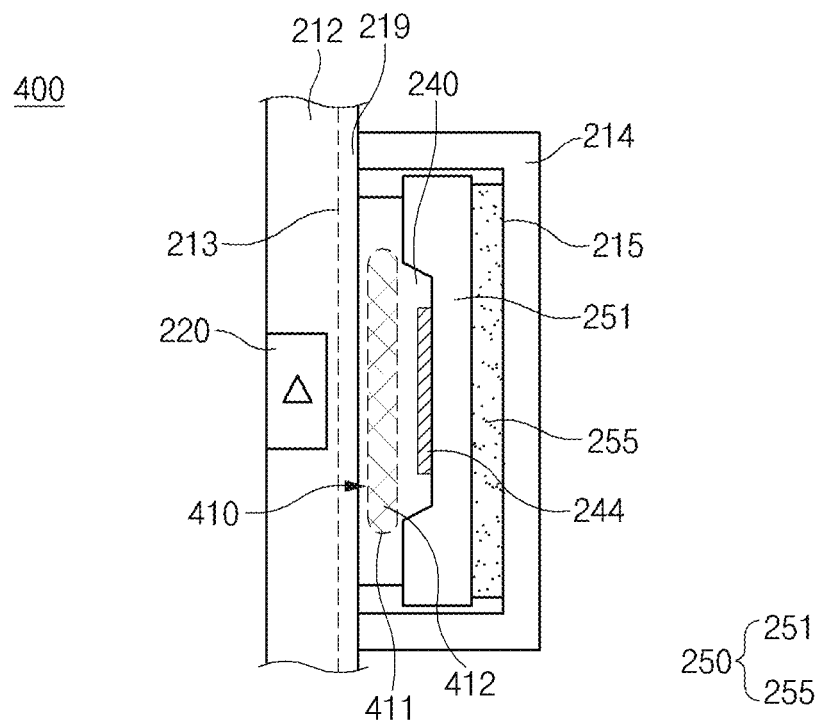
FIGS. 14A and 14B illustrate views of force key structures according to various embodiments.
Figure 14B:
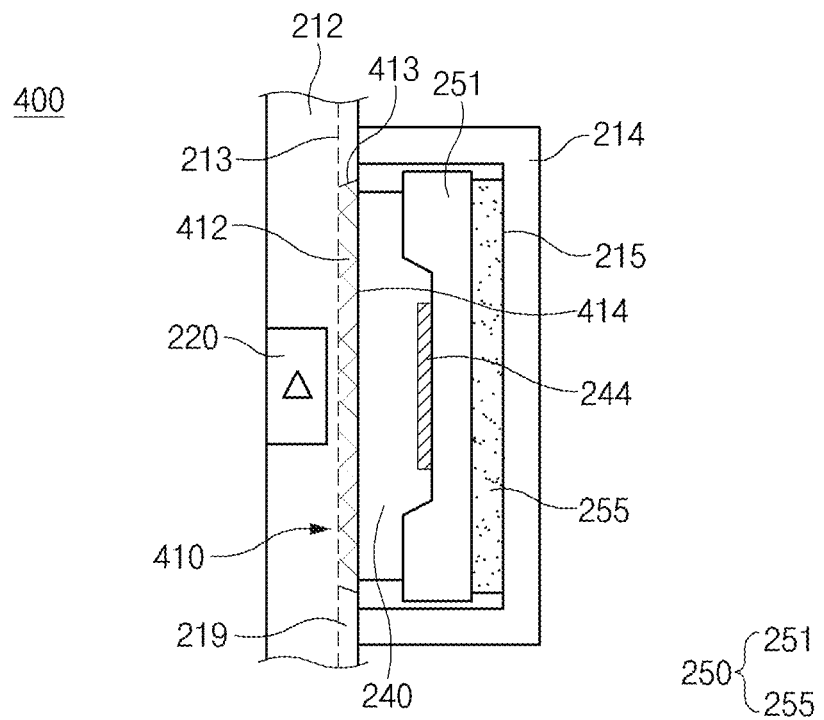

FIGS. 14A and 14B illustrate views of force key structures according to various embodiments. FIG. 14A is a view illustrating a force key structure including a pressure concentration structure including an opening. FIG. 14B is a view illustrating a force key structure including a pressure concentration structure including a recess.

Referring to FIGS. 14A and 14B, the force key structures 400 may further include the pressure concentration structures 410, respectively. Each of the pressure concentration structures 410 may be formed in a position at least partially aligned with a key area 220. For example, the pressure concentration structure 410 may include the recess 413 or the opening 411 formed on a sidewall structure 212. The pressure concentration structure 410 may be formed such that a force applied to the key area 220 is concentrated on a variable resistor 244 included in a sensor 240.

In various embodiments, the opening 411 or the recess 413 may be formed on a seating structure 219 extending toward an internal frame 214 from an inner surface 213 of the sidewall structure 212.

In the illustrated embodiment, the pressure concentration structure 410 may be formed on the inner surface 213 of the sidewall structure 212 that corresponds to the key area 220, and may reduce the thickness of the portion where the key area 220 is formed. Accordingly, the force applied to the key area 220 may be concentrated on the variable resistor 244. Thus, the sensing sensitivity of the variable resistor 244 may be improved.

In various embodiments, the pressure concentration structure 410 may include the recess 413 or the opening 411 that includes a filler 412 inside. The inner surface 213 of the sidewall structure 212 may be formed by a filler 412 received in the recess 413 and may include a filler area 414 with which part of the sensor 240 is brought into contact. The filler area 414 may have a smoother surface than a surrounding portion (e.g., the inner surface 213 of the sidewall structure 212). The filler area 414 may be formed in a position corresponding to the variable resistor 244. Accordingly, the sensor 240 may have a stable flatness.

In various embodiments, the recess 413 may be formed on at least part of an area of the sidewall structure 212 that corresponds to the sensor 240. For example, the recess 413 may be formed on an area corresponding to the variable resistor 244.

In various embodiments, the filler 412 may contain a material having a lower thermal conductivity than a metallic material contained in the sidewall structure 212. For example, the filler 412 may contain a plastic material. The variable resistor 244 may be stretched by heat. This may lower the accuracy of the sensor 240. In this case, the filler area 414 may be formed on an area corresponding to the variable resistor 244 and may block transfer of external heat to the variable resistor 244. The filler area 414 may prevent the variable resistor 244 from being stretched by heat, thereby providing high sensor accuracy.

Figure 15A:
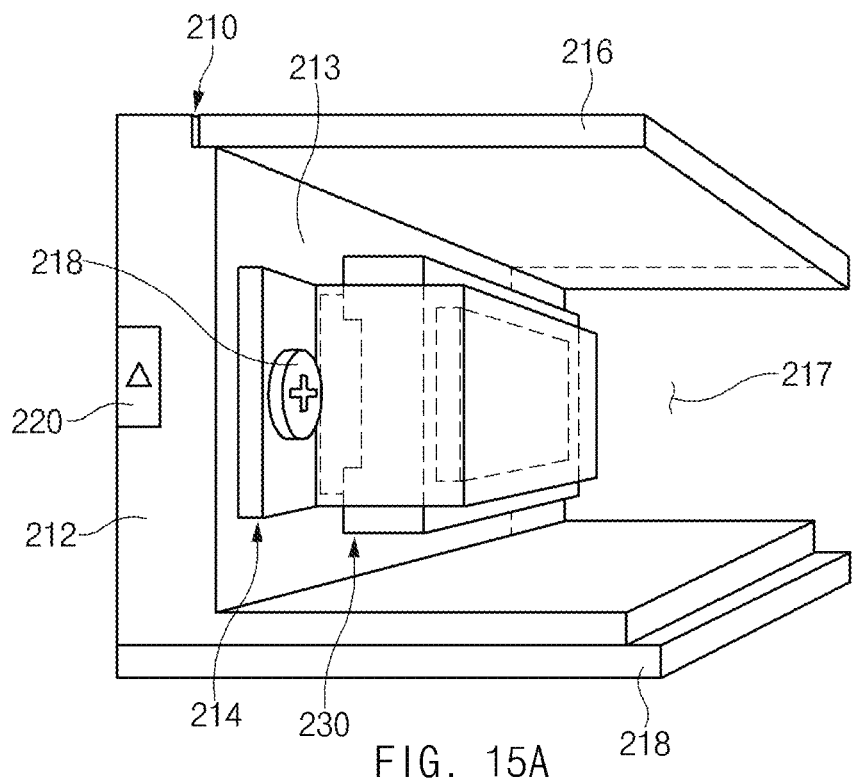
FIGS. 15A and 15B illustrate views of a coupling structure of a sidewall structure and an internal frame of an electronic device according to various embodiments.
Figure 15B:
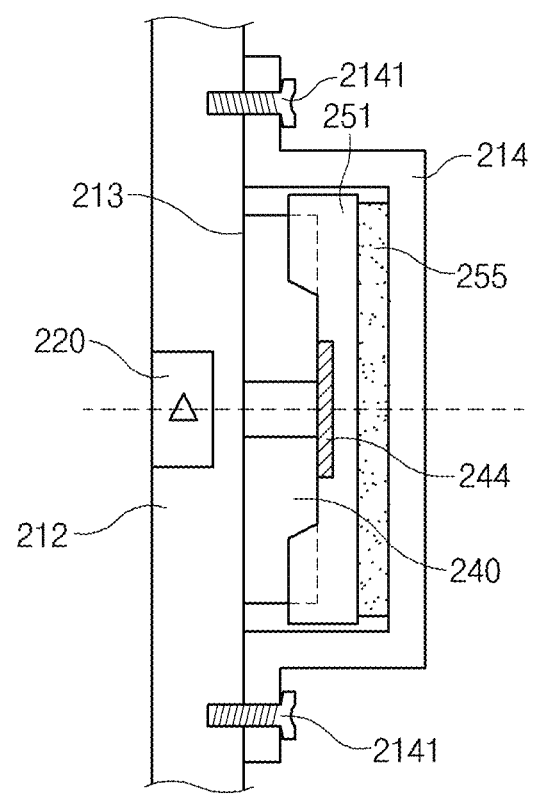

FIGS. 15A and 15B illustrate views of a coupling structure of a sidewall structure and an internal frame of an electronic device according to various embodiments. FIG. 15A is a perspective view of the coupling structure. FIG. 15B is a sectional view of the coupling structure.

In the illustrated embodiment, the electronic device may include a housing 210 that includes a sidewall structure 212 and a display 216. The housing 210 may have an internal frame 214 formed therein. The internal frame 214 may be integrated with the housing 210, or may be formed separately from the housing 210. Referring to FIGS. 15A and 15B, the internal frame 214 may be formed to be a separate structure that is coupled to the housing 210. The internal frame 214 may be coupled to an inner surface 213 of the sidewall structure 212 by screws 2141. In this case, the separate internal frame 214 may have an advantage in using an interior space 217 of the housing 210, as compared with when the internal frame 214 is integrated with the housing 210.

In various embodiments, a force key structure 200 may include the sidewall structure 212 including a key area 220, the separate internal frame 214 coupled to the sidewall structure 212, and a sensor 240, an elastic member 251, and a damping member 255 that are disposed between the sidewall structure 212 and the internal frame 214. A force applied to the key area 220 may cause elastic deformation of the sidewall structure 212 and the internal frame 214 as time elapses. The illustrated force key structure 200, including the separate internal frame 214, may prevent the housing 210 from being deformed all over.

FIGS. 16A to 16D illustrate views of an electronic device according to various embodiments.

In the illustrated embodiments, the electronic device 1600 may include a pair of first side surfaces 1601 facing each other and a pair of second side surfaces 1602 facing each other. The first side surfaces 1601 and the second side surfaces 1602 may have different lengths when viewed in the circumferential direction of the electronic device 1600. For example, the first side surfaces 1601 may be formed to be longer than the second side surfaces 1602 in the circumferential direction.

In the illustrated embodiments, the electronic device 1600 may include a force key 1610 and a button key 1620. The force key 1610 may include a single force key 1611 and a multi-force key 1612. The single force key 1611 may include the force key structures 200 illustrated in FIGS. 5A to 7. The multi-force key 1612 may include a force key in which two or more single force keys 1611 are formed in one structure. The multi-force key 1612 may include the force key structures 300 and 400 illustrated in FIGS. 8, 9, 10, 14A, and 14B.

Referring to FIG. 16A, the force key 1610 may be formed on one of the pair of first side surfaces 1601, and the button key 1620 may be formed on one of the pair of second side surfaces 1602. Referring to FIG. 16B, the force keys 1610 may be formed on the pair of first side surfaces 1601, respectively, and the button key 1620 may be formed on one of the pair of second side surfaces 1602. Referring to FIG. 16C, the electronic device 1600 may include only the force keys 1610. Referring to FIG. 16D, the force keys 1610 may be formed on the pair of first side surfaces 1601, respectively. Referring to FIGS. 16A to 16D, at least a part of the plurality of force keys 1610 may be formed to be the multi-force key 1612. The electronic device 1600 disclosed herein may include the various force keys 1610 and/or the button key 1620, but is not limited to the embodiments illustrated in the drawings.

In various embodiments, the electronic device 1600 may include a hybrid key (not illustrated) in which force keys (e.g., the single force key 1611 and the multi-force key 1612) and the button key 1620 are formed in one structure.

In the illustrated embodiments, the force keys 1610 may include keys that are related to a volume-up function, a shortcut function, and a squeezing function. In some embodiments (e.g., FIG. 16C), the force keys 1610 may include a power key.

In the illustrated embodiments, the button key 1620 may include a power key. The button key 1620 may include a key that is related to a power-on function, a rebooting function, and/or an emergency function of the electronic device 1600.

In various embodiments, the electronic device 1600 may include keys related to various functions, and the keys may be formed to be one of the button key 1620 and the force key 1610 and are not limited to the embodiments illustrated in the drawings.

An electronic device 100 according to embodiments of the disclosure may include a sidewall structure 212 that forms a surface of the electronic device and that includes a key area 220 formed on the surface of the electronic device, an internal frame 214 that is formed inside the electronic device and that faces an inner surface 213 of the sidewall structure 212, and a sensor assembly 230 disposed between the internal frame 214 and the sidewall structure 212, at least part of the sensor assembly 230 being aligned with the key area 220. The sensor assembly may include a sensor 240 that senses a force applied to the key area 220, based on displacement of an inner surface 213 of the key area 220 and a support member 250 having one surface supported on the sensor and an opposite surface supported on the internal frame.

In various embodiments, the support member may include an elastic member 251 that exerts an elastic force on the sensor, and a damping member 255 disposed between the elastic member 251 and the internal frame.

In various embodiments, the elastic member may be formed in the form of a thin plate, and the damping member may be formed in the form of foam.

In various embodiments, the sensor may include a first rigid portion 241 supported on the inner surface of the key area 220, a second rigid portion 242 supported on the inner surface of the key area 220 and spaced apart from the first rigid portion 241, and a variable resistor 244 extending from the first rigid portion 241 to the second rigid portion 242, and the variable resistor 244 may be formed to be stretchable.

In various embodiments, the sensor may further include a flexible portion 243 formed between the first rigid portion 241 and the second rigid portion 242, the flexible portion 243 may be formed such that at least part thereof is aligned with the key area 220, and the variable resistor 244 may extend across the flexible portion 243 from the first rigid portion 241 to the second rigid portion 242.

In various embodiments, the flexible portion 243 may include an air gap formed by the first rigid portion 241, the second rigid portion 242, and the inner surface 213 of the sidewall structure 212.

In various embodiments, the sensor may include a first rigid portion supported on the inner surface of the key area, a second rigid portion supported on the inner surface of the key area and spaced apart from the first rigid portion, and a variable resistor extending from the first rigid portion to the second rigid portion, the variable resistor being stretchable in an extension direction. The electronic device may further include control circuitry 270 electrically connected to the variable resistor, and the control circuitry 270 may be configured to detect the force applied to the key area 220, based on a voltage value applied to the variable resistor 244.

In various embodiments, the support member may include an elastic member 370 that makes contact with the sensor 310 to exert an elastic force on the sensor 310, and a damping member 330 formed to absorb a force applied to the key area. The elastic member 370 may include a first extension 371 that supports the sensor 310, a second extension 372 that faces the first extension 371 and that is supported on the damping member 330, and a curved portion 373 formed between the first extension 371 and the second extension 372.

In various embodiments, the sensor 310 may include a first rigid portion 311, a second rigid portion 312 spaced apart from the first rigid portion 311, a flexible portion 315 formed between the first rigid portion and the second rigid portion, and a variable resistor formed inside the flexible portion 315. The first extension 371 of the elastic member 370 may include a slit 375-1 aligned with the flexible portion 315 of the sensor 310, and in a pressed state in which a force is applied to the key area 220, at least part of the flexible portion 315 of the sensor 310 may be received in the slit 375-1, and the variable resistor may be stretched.

In various embodiments, a recess 413, at least part of which corresponds to the variable resistor 244, may be formed on the inner surface 213 of the sidewall structure 212.

In various embodiments, the sensor 310 may include a rigid portion 311, 312, 313, 314 and a flexible portion 315, 316 that make contact with the inner surface 213 of the key area 220 and that are supported by the support member such as the elastic 320 or the damping member 330, and a variable resistor 318 formed on the rigid portion 311, 312, 313, 314 and the flexible portion 315, 316. The rigid portion 311, 312, 313, 314 may include a first rigid portion 311, a second rigid portion 312 spaced apart from the first rigid portion 311, and a third rigid portion 313 disposed between the first rigid portion 311 and the second rigid portion 312. The flexible portion 315, 316 may include a first flexible portion 315 disposed between the first rigid portion 311 and the third rigid portion 313 and a second flexible portion 316 disposed between the second rigid portion 312 and the third rigid portion 313. The variable resistor 318 may include a first variable resistor 318-1 extending from the first rigid portion 311 to the third rigid portion 313 through the first flexible portion 315 and a second variable resistor 318-2 extending from the second rigid portion 312 to the third rigid portion 313 through the second flexible portion 316.

In various embodiments, the sensor assembly may have a thickness greater than an interval between the sidewall structure and the internal frame so as to be press-fit into a space between the sidewall structure and the internal frame.

In various embodiments, the key area may include a first key area 220-1 and a second key area 220-2 spaced apart from the first key area 220-1 at a predetermined interval. The sensor 310 may include a first sensor structure 310-1 aligned with the first key area to sense a force applied to the first key area 220-1 and a second sensor structure 310-2 aligned with the second key area to sense a force applied to the second key area 220-2. The elastic member 320 may include a first elastic portion 320-1 that exerts an elastic force on the first sensor structure 310-1, a second elastic portion 320-2 that exerts an elastic force on the second sensor structure 310-2, and a third elastic portion 320-3 formed between the first elastic portion 320-1 and the second elastic portion 320-2. The third elastic portion 320-3 may have a higher modulus of elasticity than the first elastic portion 320-1 and the second elastic portion 320-2.

An electronic device according to embodiments of the disclosure may include a sidewall structure that forms a surface of the electronic device, an internal frame disposed inside the electronic device, and a force key structure. The force key structure may include a key area formed on part of the surface of the electronic device, a sensor 310 disposed between the sidewall structure and the internal frame, at least part of the sensor being aligned with the key area, and a support member disposed between the sensor 310 and the internal frame. The sensor 310 and the support member may be press-fit between the sidewall structure and the internal frame.

In various embodiments, the force key structure may be formed such that opposite sides thereof are symmetric to each other with respect to a central axis passing through the key area.

In various embodiments, the sensor 310 may include a first rigid portion, a second rigid portion spaced apart from the first rigid portion, a flexible portion formed between the first rigid portion and the second rigid portion, and a variable resistor extending from the first rigid portion to the second rigid portion. The flexible portion may be formed in a position aligned with the key area, and the variable resistor may be stretchable.

In various embodiments, the support member may include an elastic member that makes contact with the sensor 310 to exert an elastic force on the sensor 310 and a damping member disposed between the elastic member and the internal frame, and the elastic member may be convexly bent toward the internal frame in a pressed state in which a force is applied to the key area.

In various embodiments, the support member may include an elastic member 320 that supports the sensor 310 to exert an elastic force on the sensor 310 and a damping member 330 that supports at least part of the elastic member 320. The key area may include a first key area 220-1 related to a first function of the electronic device and a second key area 220-2 related to a second function of the electronic device. The force key structure may include a first structure 301 that detects pressure applied to the first key area, a second structure 302 that detects pressure applied to the second key area, and a third structure 303 disposed between the first structure and the second structure to separate pressure applied to the first structure and pressure applied to the second structure. The elastic member may include a first elastic portion 320-1 included in the first structure, a second elastic portion 320-2 included in the second structure, and a third elastic portion 320-3 included in the third structure. The third elastic portion 320-3 may be formed to be thicker than the first elastic portion 320-1 or the second elastic portion 320-2.

In various embodiments, the internal frame may include a first support surface 341 included in the first structure 301, a second support surface 342 included in the second structure 302, and a protrusion 343 included in the third structure 303. The damping member 330 may include a first damping member 331 disposed between the first support surface 341 and the first elastic portion 320-1 and a second damping member 332 disposed between the second support surface 342 and the second elastic portion 320-2. The protrusion 343 may be disposed between the first damping member 331 and the second damping member 332 and may protrude toward the third elastic portion 320-3.

In various embodiments, the sensor 310 may include a first sensor structure included in the first structure and a second sensor structure included in the second structure, and an air gap may be formed between the first sensor structure and the second sensor structure.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device 100). For example, a processor (e.g., the processor) of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to the embodiments of the disclosure, the force key structures may block infiltration of external foreign matter into the electronic devices. In addition, the force key structures may uniformly maintain sensor performance despite a change in external temperature or repeated use thereof.

In addition, the disclosure may provide various effects that are directly or indirectly recognized.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a sidewall structure configured to form a surface of the electronic device, the sidewall structure including a key area formed on the surface of the electronic device;
an internal frame formed inside the electronic device and configured to face an inner surface of the sidewall structure; and
a sensor assembly disposed between the internal frame and the sidewall structure, at least part of the sensor assembly being aligned with the key area,
wherein the sensor assembly includes:
a sensor configured to sense a force applied to the key area, based on displacement of an inner surface of the key area, and
a support member including one surface that is supported on the sensor and an opposite surface that is supported on the internal frame, and
wherein the sensor includes:
a first rigid portion supported on the inner surface of the key area,
a second rigid portion supported on the inner surface of the key area and spaced apart from the first rigid portion, and
a variable resistor extending from the first rigid portion to the second rigid portion.

2. The electronic device of claim 1, wherein the support member includes an elastic member configured to exert an elastic force on the sensor and a damping member disposed between the elastic member and the internal frame.

3. The electronic device of claim 2, wherein:
the elastic member is a thin plate, and
the damping member is foam.

4. The electronic device of claim 1, wherein
the variable resistor is formed to be stretchable.

5. The electronic device of claim 1, wherein:
the sensor further includes a flexible portion formed between the first rigid portion and the second rigid portion,
the flexible portion is formed such that at least part thereof is aligned with the key area, and
the variable resistor extends across the flexible portion from the first rigid portion to the second rigid portion.

6. The electronic device of claim 5, wherein the flexible portion includes an air gap formed by the first rigid portion, the second rigid portion, and the inner surface of the sidewall structure.

7. The electronic device of claim 1, wherein:
the sensor includes a rigid portion and a flexible portion configured to make contact with the inner surface of the key area and supported by the support member, and a variable resistor formed on the rigid portion and the flexible portion,
the rigid portion includes a first rigid portion, a second rigid portion spaced apart from the first rigid portion, and a third rigid portion disposed between the first rigid portion and the second rigid portion,
the flexible portion includes a first flexible portion disposed between the first rigid portion and the third rigid portion and a second flexible portion disposed between the second rigid portion and the third rigid portion, and
the variable resistor includes a first variable resistor extending from the first rigid portion to the third rigid portion through the first flexible portion and a second variable resistor extending from the second rigid portion to the third rigid portion through the second flexible portion.

8. The electronic device of claim 1, wherein the sensor assembly has a thickness greater than an interval between the sidewall structure and the internal frame so as to be press-fit into a space between the sidewall structure and the internal frame.

9. The electronic device of claim 1, wherein:
the sensor includes a first rigid portion supported on the inner surface of the key area, a second rigid portion supported on the inner surface of the key area and spaced apart from the first rigid portion, and a variable resistor extending from the first rigid portion to the second rigid portion, the variable resistor being stretchable in an extension direction,
the electronic device further comprises control circuitry electrically connected to the variable resistor, and
the control circuitry is configured to detect the force applied to the key area, based on a voltage value applied to the variable resistor.

10. The electronic device of claim 2, wherein:
the key area includes a first key area and a second key area spaced apart from the first key area at a predetermined interval,
the sensor includes a first sensor structure aligned with the first key area to sense a first force applied to the first key area and a second sensor structure aligned with the second key area to sense a second force applied to the second key area,
the elastic member includes a first elastic portion configured to exert a first elastic force on the first sensor structure, a second elastic portion configured to exert a second elastic force on the second sensor structure, and a third elastic portion formed between the first elastic portion and the second elastic portion, and
the third elastic portion has a higher modulus of elasticity than the first elastic portion and the second elastic portion.

11. An electronic device comprising:
a sidewall structure configured to form a surface of the electronic device;
an internal frame disposed inside the electronic device; and
a force key structure,
wherein the force key structure includes:
a key area formed on part of the surface of the electronic device,
a sensor disposed between the sidewall structure and the internal frame, at least part of the sensor being aligned with the key area, and
a support member disposed between the sensor and the internal frame, and
wherein the sensor and the support member are press-fit between the sidewall structure and the internal frame, and
wherein the sensor includes:
a first rigid portion, a second rigid portion spaced apart from the first rigid portion, a flexible portion formed between the first rigid portion and the second rigid portion, and a variable resistor extending from the first rigid portion to the second rigid portion.

12. The electronic device of claim 11, wherein the force key structure is formed such that opposite sides thereof are symmetric to each other with respect to a central axis passing through the key area.

13. The electronic device of claim 11, wherein:

the flexible portion is formed in a position aligned with the key area, and the variable resistor is stretchable.

14. The electronic device of claim 11, wherein:

the support member includes an elastic member configured to make contact with the sensor to exert an elastic force on the sensor and a damping member disposed between the elastic member and the internal frame, and the elastic member is convexly bent toward the internal frame in a pressed state that applies a force to the key area.

15. The electronic device of claim 11, wherein:

the support member includes an elastic member configured to make contact with the sensor to exert an elastic force on the sensor and a damping member formed to absorb a force applied to the key area, and the elastic member includes a first extension configured to support the sensor, a second extension configured to face the first extension and supported on the damping member, and a curved portion formed between the first extension and the second extension.

16. The electronic device of claim 11, wherein a recess is formed on an inner surface of the sidewall structure and at least part of the recess corresponds to the variable resistor.

17. The electronic device of claim 11, wherein:

the variable resistor is formed inside the flexible portion, the first extension of the elastic member includes a slit aligned with the flexible portion of the sensor, and in a pressed state a force is applied to the key area, at least part of the flexible portion of the sensor is received in the slit, and the variable resistor is stretched in a lengthwise direction.

18. The electronic device of claim 11, wherein:

the support member includes an elastic member configured to support the sensor to exert an elastic force on the sensor and a damping member configured to support at least part of the elastic member, the key area includes a first key area related to a first function of the electronic device and a second key area related to a second function of the electronic device, the force key structure includes a first structure configured to detect a first pressure applied to the first key area, a second structure configured to detect a second pressure applied to the second key area, and a third structure disposed between the first structure and the second structure to separate the first pressure applied to the first structure and the second pressure applied to the second structure, the elastic member includes a first elastic portion included in the first structure, a second elastic portion included in the second structure, and a third elastic portion included in the third structure, and the third elastic portion is formed to be thicker than the first elastic portion or the second elastic portion.

19. The electronic device of claim 18, wherein:

the internal frame includes a first support surface included in the first structure, a second support surface included in the second structure, and a protrusion included in the third structure, the damping member includes a first damping member disposed between the first support surface and the first elastic portion and a second damping member disposed between the second support surface and the second elastic portion, and the protrusion is disposed between the first damping member and the second damping member and protrudes toward the third elastic portion.

20. The electronic device of claim 19, wherein:

the sensor includes a first sensor structure included in the first structure and a second sensor structure included in the second structure, and an air gap is formed between the first sensor structure and the second sensor structure.

* * * * *